US011856302B2

(12) United States Patent
Kelly et al.

(10) Patent No.: US 11,856,302 B2
(45) Date of Patent: Dec. 26, 2023

(54) SYSTEMS AND METHODS FOR DIGITAL IMAGING USING COMPUTATIONAL PIXEL IMAGERS WITH MULTIPLE IN-PIXEL COUNTERS

(71) Applicant: Anduril Industries, Inc., Costa Mesa, CA (US)

(72) Inventors: Michael W. Kelly, North Reading, MA (US); Curtis Colonero, Shrewsbury, MA (US); Christopher David, Chelmsford, MA (US); Joseph Bari, Concord, MA (US); William Ross, Westford, MA (US)

(73) Assignee: Anduril Industries, Inc., Costa Mesa, CA (US)

( * ) Notice: Subject to any disclaimer, the term of this patent is extended or adjusted under 35 U.S.C. 154(b) by 0 days.

(21) Appl. No.: 18/083,783

(22) Filed: Dec. 19, 2022

(65) Prior Publication Data
US 2023/0121928 A1 Apr. 20, 2023

Related U.S. Application Data

(63) Continuation of application No. 17/425,767, filed as application No. PCT/US2020/016601 on Feb. 4, 2020, now Pat. No. 11,785,347.
(Continued)

(51) Int. Cl.
H04N 23/741 (2023.01)
G06T 7/194 (2017.01)
(Continued)

(52) U.S. Cl.
CPC .............. *H04N 23/741* (2023.01); *G06T 3/40* (2013.01); *G06T 7/194* (2017.01); *G06T 7/60* (2013.01);
(Continued)

(58) Field of Classification Search
CPC ...... G01S 17/34; G01S 17/894; G01S 7/4863; G01S 7/4865; G06T 3/40; G06T 7/194;
(Continued)

(56) References Cited

U.S. PATENT DOCUMENTS 6,674,887 B1 * 1/2004 Wu ........................ G01N 21/89
382/141
11,567,308 B2 1/2023 D'Angelo
(Continued)

FOREIGN PATENT DOCUMENTS

CN 1659860 6/2010
JP 2001289951 10/2001

OTHER PUBLICATIONS

Blanquart L et al., "XPAD, a new read-out pixel chip for X-ray counting", Nuclear Science Symposium Conference Record, 2000 IEEE Lyon, France, vol. 2, Oct. 15, 2000, pp. 9 92-9 97.
(Continued)

*Primary Examiner* — Amy R Hsu
(74) *Attorney, Agent, or Firm* — Van Pelt, Yi & James LLP

(57) ABSTRACT

A stereo imaging system includes an optical assembly and a computational pixel imager (CPI) having a plurality of pixels. Each pixel includes a light sensor and counters that convert a photocurrent from the light sensor to a digital signal. The optical assembly, which directs light from a light field to the CPI, includes an optical field combiner and first and second primary lens assemblies, which are configured to receive first and second portions of the light from the lightfield, respectively, and to direct the first and second portions of the light to the optical field combiner. The optical field combiner includes a modulator configured to modulate the first and second portions of the light and to direct modulated first and second portions of the light onto the CPI.
(Continued)

The counters are configured to perform digital signal processing on the digital signal.

15 Claims, 20 Drawing Sheets

Related U.S. Application Data

(60) Provisional application No. 62/807,683, filed on Feb. 19, 2019, provisional application No. 62/800,685, filed on Feb. 4, 2019.

(51) Int. Cl.
| | |
|---|---|
| *G06T 3/40* | (2006.01) |
| *G06T 7/60* | (2017.01) |
| *H04N 23/11* | (2023.01) |
| *H04N 23/51* | (2023.01) |
| *H04N 23/56* | (2023.01) |
| *H04N 23/71* | (2023.01) |
| *H04N 23/74* | (2023.01) |
| *H04N 23/957* | (2023.01) |
| *H04N 25/75* | (2023.01) |
| *H04N 25/767* | (2023.01) |
| *H04N 25/772* | (2023.01) |
| *H01L 27/146* | (2006.01) |

(52) U.S. Cl.
CPC ............. *H04N 23/11* (2023.01); *H04N 23/51* (2023.01); *H04N 23/56* (2023.01); *H04N 23/71* (2023.01); *H04N 23/74* (2023.01); *H04N 23/957* (2023.01); *H04N 25/75* (2023.01); *H04N 25/767* (2023.01); *H04N 25/772* (2023.01); *H01L 27/14681* (2013.01)

(58) Field of Classification Search
CPC ..... G06T 7/60; H03K 23/64; H01L 27/14681; H04N 23/11; H04N 23/51; H04N 23/56; H04N 23/71; H04N 23/74; H04N 23/741; H04N 23/957; H04N 25/44; H04N 25/75; H04N 25/767; H04N 25/772; H04N 3/09; H04N 5/33

See application file for complete search history.

(56) References Cited

U.S. PATENT DOCUMENTS

| | | | |
|---|---|---|---|
| 2002/0033445 A1 | 3/2002 | Mattison | |
| 2003/0189657 A1 | 10/2003 | Hammadou | |
| 2004/0141587 A1 | 7/2004 | Arques | |
| 2007/0182949 A1* | 8/2007 | Niclass | G01S 7/491 356/3 |
| 2011/0235771 A1 | 9/2011 | Aull | |
| 2013/0003911 A1 | 1/2013 | Schultz | |
| 2013/0258152 A1 | 10/2013 | Balannik | |
| 2014/0009581 A1 | 1/2014 | Cheng | |
| 2014/0034809 A1 | 2/2014 | Jie | |
| 2015/0288890 A1 | 10/2015 | Senda | |
| 2016/0227135 A1 | 8/2016 | Matolin | |
| 2016/0266242 A1 | 9/2016 | Gilliland | |
| 2017/0041571 A1 | 2/2017 | Tyrrell | |
| 2017/0261611 A1 | 9/2017 | Takahashi | |
| 2018/0067237 A1 | 3/2018 | Vandame | |
| 2018/0203217 A1 | 7/2018 | Knebel | |
| 2018/0214057 A1 | 8/2018 | Schultz | |
| 2018/0246212 A1 | 8/2018 | Moore | |
| 2018/0299535 A1 | 10/2018 | Jew | |
| 2018/0302562 A1 | 10/2018 | Newcombe | |
| 2019/0109973 A1* | 4/2019 | Riza | H04N 23/55 |
| 2020/0284883 A1* | 9/2020 | Ferreira | G01S 7/4816 |
| 2022/0166948 A1* | 5/2022 | Kelly | H04N 23/56 |

OTHER PUBLICATIONS

Cristiano Niclass et al., "Single-Photon Synchronous Detection", IEEE Journal of Solid-State Circuits, IEEE, USA, vol. 44, No. 7, Jul. 1, 2009, pp. 1977-1989.

Kiyoharu Aizawa et al., "Computational Image Sensor for on Sensor Compression", IEEE Transactions on Electron Devices, IEEE Service Center, Piscataway, NJ, US vol. 44, No. 10; Oct. 1, 1997.

BRONZI e al.: "SPADAS: a high-speed 3D single-photon camera for advanced driver assistance systems", Proceedings of SPIE, IEEE, US, vol. 9366, Feb. 27, 2015 (Feb. 267, 2015), pp. 93660M-93660M.

Danilo Bronzi et al., "Automotive Three-Dimensional Vision Through a Single-Photon Counting SPAD Camera", IEEE Transactions On Intelligent Transportation Systems, vol. 17, No. 3, Mar. 1, 2016 (Mar. 1, 2016), pp. 782-795.

Nirzhar Saha er al., "Survey on optical camera communications: challenges and opportunities", IET Optoelectronics, the Institution of Engineering and Technology, vol. 9, No. 5, Oct. 1, 2015 (Oct. 1, 2015), pp. 172-183.

Soo-Yong Jung et al., "TDOA-based optical wireless indoor localization using LED ceiling lamps", IEEE Transactions On Consumer Electronics, IEEE Service Center, vol. 57, No. 4, Nov. 1, 2011 (Nov. 1, 2011), pp. 1592-1597.

\* cited by examiner

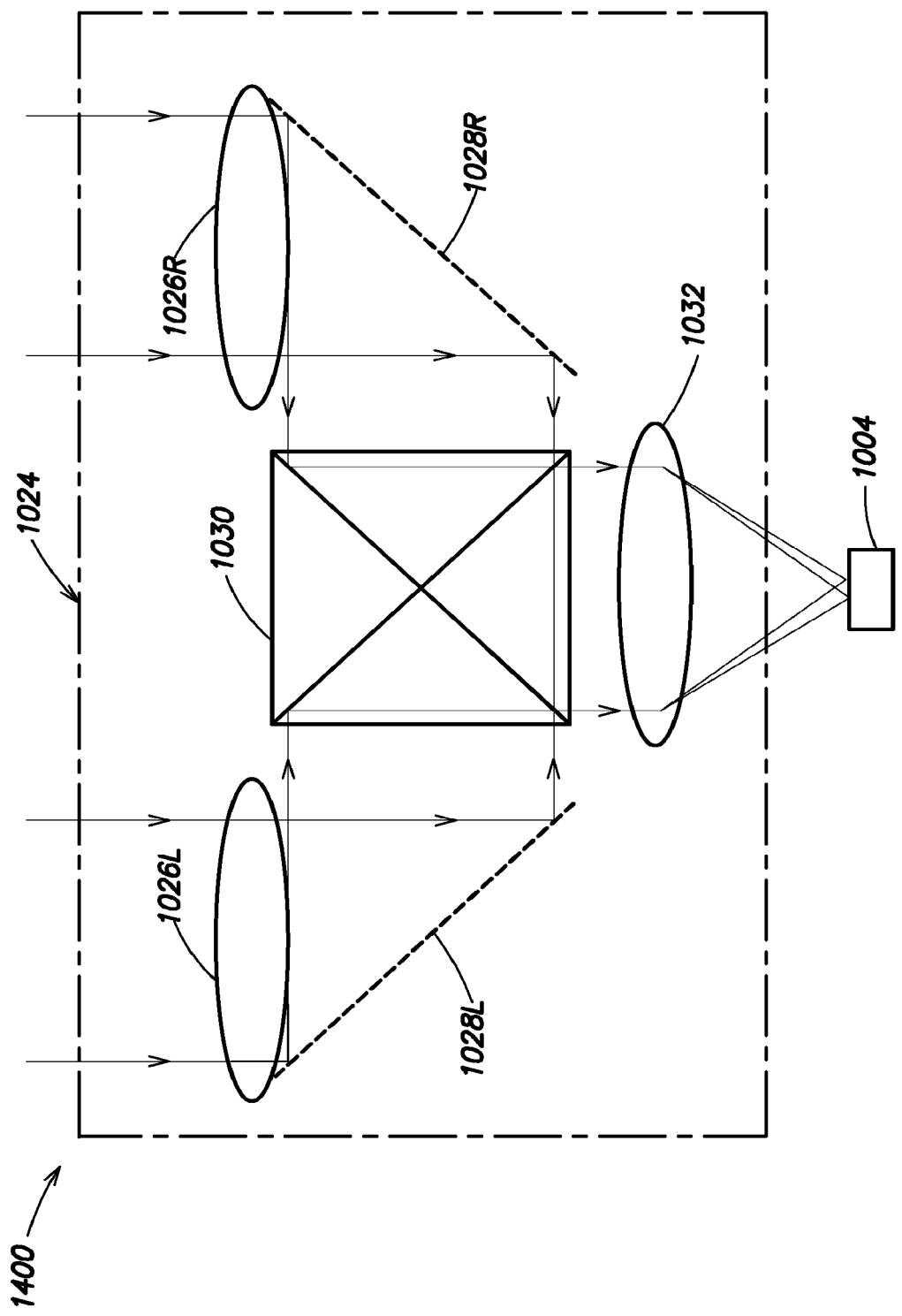

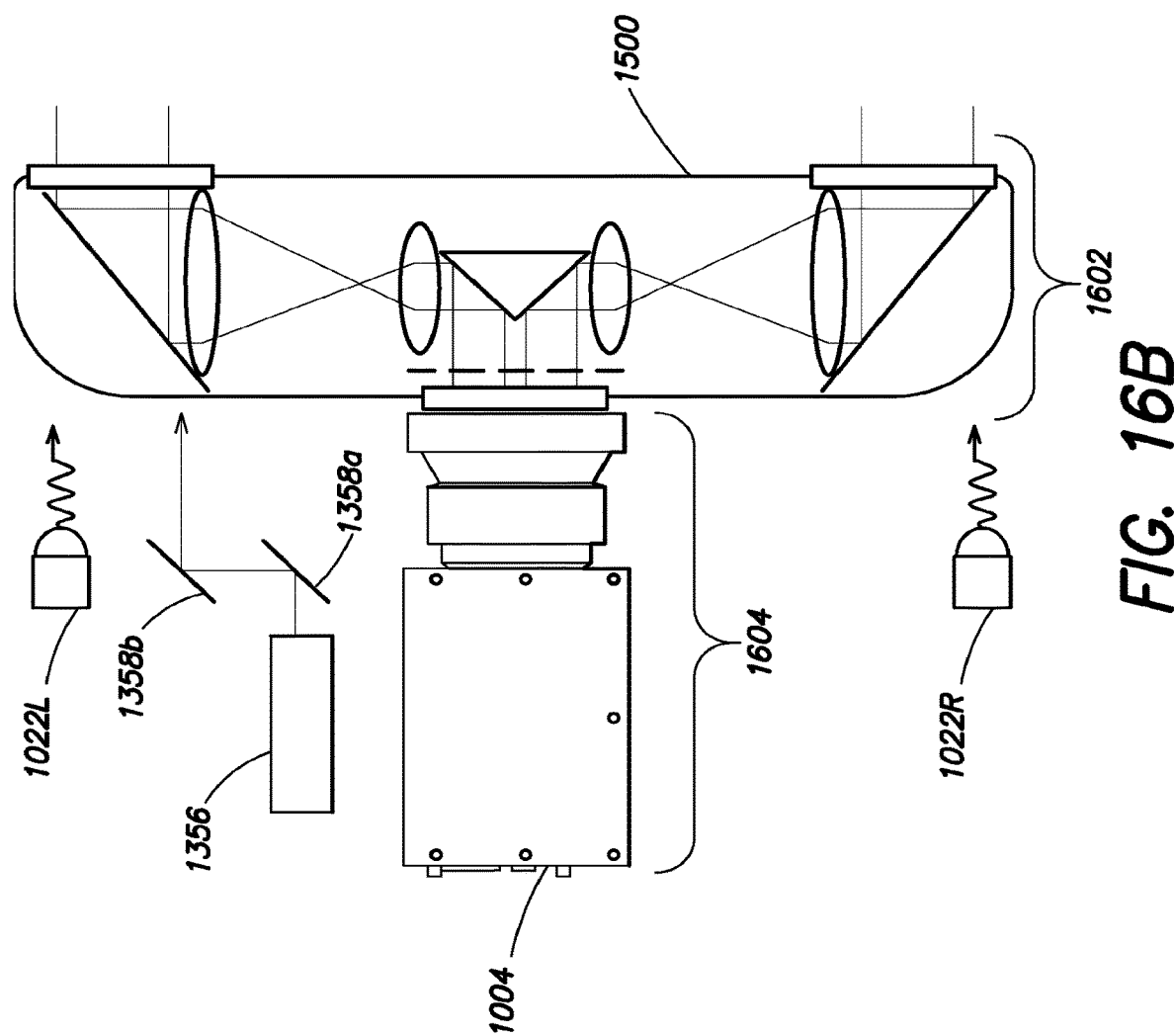

SYSTEMS AND METHODS FOR DIGITAL IMAGING USING COMPUTATIONAL PIXEL IMAGERS WITH MULTIPLE IN-PIXEL COUNTERS

CROSS REFERENCE TO RELATED APPLICATIONS

This application is a continuation of U.S. patent application Ser. No. 17/425,767 entitled "SYSTEMS AND METHODS FOR DIGITAL IMAGING USING COMPUTATIONAL PIXEL IMAGERS WITH MULTIPLE IN-PIXEL COUNTERS" filed Jul. 26, 2021 which is incorporated herein by reference for all purposes, which is a national stage filing under 35 U.S.C. § 371 of International Patent Application No. PCT/US20/16601 entitled "SYSTEMS AND METHODS FOR DIGITAL IMAGING USING COMPUTATIONAL PIXEL IMAGERS WITH MULTIPLE IN-PIXEL COUNTERS" filed Feb. 4, 2020 which is incorporated herein by reference for all purposes, which claims the benefit of U.S. Provisional Patent Application No. 62/800,685, entitled "MULTI-FUNCTION TIME MULTIPLEXED CAMERA" filed Feb. 4, 2019 which is incorporated herein by reference for all purposes, and claims priority to U.S. Provisional Patent Application No. 62/807,683 entitled "EVENT-BASED VISION AND INTER-FRAME VIDEO COMPRESSION" filed Feb. 19, 2019 which is incorporated herein by reference for all purposes.

FIELD

The described systems and methods relate to imaging arrays that include integrated circuitry for in-pixel data-processing for active and passive imaging of an environment, including stereographic imaging and wide-area imaging.

BACKGROUND

Conventional imaging using integrated-circuit technology typically involves an array of pixels, e.g., a focal plane array (FPA). Each of the pixels may be a charge-coupled device (CCD) or complementary metal-oxide semiconductor (CMOS) device, in which photocurrent generated by illumination of a photodiode of the pixel accumulates charge on a capacitor of the pixel. At the end of an exposure period, the amount of charge stored on the pixel's capacitor is read out of the array for subsequent image processing.

Recently, digital focal plane arrays (DFPAs) have been developed as a different approach to imaging. A DFPA may include an array of pixels, in which pixel circuitry in each pixel is able to digitize a detected photocurrent signal and to perform some signal processing operations within the array of pixels.

SUMMARY

Aspects of the technology presented herein relate to advanced imaging arrays of pixels that include integrated circuits within each pixel of the arrays to digitize detected photocurrent signals and to perform advanced signal-processing functions within the pixel.

According to an aspect of the present technology, a computational pixel imager (CPI) is provided. The CPI may include an array of pixels. Each pixel may include a photodetector configured to detect light and to produce photocurrent signals from the detected light. Each pixel also may include integrated circuitry that digitizes the photocurrent signals produced by the photodetector. The integrated circuitry of each pixel may include two or more counters that may be controlled independently of the other counter(s), to perform different image-processing functions concurrently. Additionally, the counters may be configured for infinite-dynamic-range sensing. Further, each of the pixels may be modulated to perform digital down-sampling of detected modulated light.

In some embodiments of this aspect, a CPI may include a pixel integrated circuit comprising a b-bit counter, a data line arranged to transmit a value of a most significant bit of the b-bit counter, and read-out circuitry configured to read the most significant bit at a higher read-out rate than a read-out rate for other bits of the b-bit counter.

In some embodiments of this aspect, a method of accumulating counts with a b-bit counter is provided. The method may include acts of accumulating counts on the b-bit counter, and reading, by read-out circuitry, data from a most significant bit of the b-bit counter at a higher read-out rate than a read-out rate for other bits of the b-bit counter.

In some embodiments of this aspect, a CPI may include an array of pixels and a modulation source. Some or all of the pixels may each include a photodetector, a detector biasing line arranged to apply a bias or supply voltage modulated at a first frequency from the modulation source to the detector, and one or more counters arranged to digitize a signal (e.g., a photocurrent signal) received from the photodetector.

In some embodiments of this aspect, a method of down-sampling with a pixel integrated circuit is provided. The method may include acts of: illuminating an object with light modulated at a first frequency; receiving, at a detector of the pixel integrated circuit, the modulated light returned from the object; and modulating a bias or supply applied to the detector with a second frequency that differs from the first frequency.

In some embodiments of this aspect, a CPI is provided. The CPI may comprise a modulated source and a plurality of pixels, each pixel including a detector, a detector biasing line arranged to apply a bias or supply voltage modulated at a first frequency from the modulated source to the detector, and one or more counters arranged to digitize a signal received from the detector.

In some embodiments of this aspect, a method of multi-thread processing in a pixel of an array of pixels is provided. The method may include acts of: receiving photons at a sensor in a first pixel in the array; controlling a first counter connected to the sensor and located in the first pixel to create a first digital signal for first image data in response to the received photons; controlling a second counter connected to the sensor and located in the first pixel to create a second digital signal for second image data in response to the received photons; performing a first computational algorithm with a first value from the first counter to compute the first image data; and while performing the first computational algorithm, performing a second computational algorithm different from the first computational algorithm with a second value from the second counter to compute the second image data.

In some embodiments of this aspect, a CPI may include an array of pixels each including a photodetector and two or more counters arranged to digitize two or more different signals from the photodetector. A first of the two or more counters may be connected to one or more first counters in one or more adjacent pixels. A second of the two or more counters may be connected to one or more second counters in one or more adjacent pixels. A first image-processing function may be performed with the first counters and a second image-processing function, different from the first image-processing function, may be performed with the second counters.

In some embodiments of this aspect, a CPI having an array of pixels is provided. At least one pixel in the array may comprise a detector, a first transistor connected to the detector, and two or more second transistors connected in parallel between the first transistor and two or more signal converters. The signal converters may be current-to-frequency or voltage-to-frequency converters.

According to another aspect of the present technology, a method is provided for performing multi-thread processing in each pixel of an array of pixels of a CPI. The method may comprise acts of: receiving photons at a sensor in a first pixel of the array; controlling a first counter connected to the sensor and located in the first pixel to create a first digital signal for first image data in response to the received photons; controlling a second counter connected to the sensor and located in the first pixel to create a second digital signal for second image data in response to the received photons; performing a first computational algorithm using a first value from the first counter to compute the first image data; and, while performing the first computational algorithm, performing a second computational algorithm using a second value from the second counter to compute the second image data. The first and second computational algorithms may be different from each other.

According to yet another aspect of the present technology, a stereo imaging system is provided. The system may comprise a computational pixel imager (CPI) and an optical assembly configured to receive light from a light field and to direct the light to the CPI. The CPI may have a plurality of pixels, with each of the pixels including a light sensor and a plurality of counters configured to receive a photocurrent from the light sensor and to convert the photocurrent to a digital signal. The optical assembly may include an optical field combiner and first and second primary lens assemblies configured to receive first and second portions of the light from the light field, respectively, and to direct the first and second portions of the light to the optical field combiner. The optical field combiner may include a modulator configured to modulate the first and second portions of the light and to direct modulated first and second portions of the light onto the CPI. The counters of the CPI may be configured to perform digital signal processing on the digital signal.

In some embodiments of this aspect, the modulator may include first and second reflective modulators that modulate and reflect the first and second portions of the light to a mirror device of the optical field combiner. The mirror device may direct the modulated first and second portions of the light onto the CPI.

In some embodiments of this aspect, the optical field combiner may include first and second fold mirrors that reflect the first and second portions of the light from the first and second primary lens assemblies onto the multi-sided mirror. The multi-sided fold mirror may direct the first and second portions of the light onto the CPI via the modulator.

In some embodiments of this aspect, the light from the light field may include light reflected from an object. The CPI may process the modulated first and second portions of the light to yield image data for a stereo image of the object.

In various embodiments of this aspect, the system may further comprise one or more light source(s) configured to illuminate the object.

In some embodiments of this aspect, the pixels of the CPI may be configured to detect short-wavelength infrared (SWIR) radiation, which may have a wavelength in a range of about 0.75 µm to about 3 µm.

In some embodiments of this aspect, the pixels of the CPI may be configured to detect mid-wavelength infrared (MWIR) radiation, which may have a wavelength in a range of about 3 µm to about 5 µm.

In some embodiments of this aspect, the pixels of the CPI may include high operating temperature (HOT) sensors configured to detect radiation in a range of about 3 µm to about 5 µm.

In some embodiments of this aspect, the system may further comprise a rotatable field scanner configured to perform a wide-area scan of the light field such that a field of view of the optical assembly is greater than about 45° (e.g., greater than about 90° or 120° or higher). The rotatable field scanner may be configured to enable light from a plurality of views of the light field to be received by the first and second primary lens assemblies. In one implementation, the rotatable field scanner may be configured to enable light from a first field of view to be received by the first primary lens assembly, and light from a second field of view to be received by the second primary lens assembly. For example, the first field of view may be a forward view, and the second field of view may be a rearward view.

In some embodiments of this aspect, the system may further comprise: a first field scanner arranged relative to the first primary lens assembly such that the first portion of the light from the light field corresponds to light from the first field scanner; and a second field scanner portion arranged relative to the second primary lens assembly such that the second portion of the light from the light field corresponds to light from the second field scanner. For example, one or both of the first and second field scanners may cover an angular field of view greater than about 45° (e.g., greater than about 90° or 120° or higher).

In some embodiments of this aspect, the optical assembly may be housed in a first housing, the CPI may be housed in a second housing, and the first and second housings may be detachable from each other. In some implementations, the first and second housings may be detachable from each other via a flange connector. In some implementations, the first housing or the second housing or both the first and second housings may be configured to be supported on a vehicle (e.g., an automobile). In some implementations, the system may further comprise at least one light source configured to illuminate an object, and a controller configured to control a timing of the at least one light source. The at least one light source may include any one or any combination of: a laser that emits light at generally a single wavelength, and a broadband emitter that emits light having a range of different wavelengths. The laser may be configured to emit light having a wavelength in a range of about 0.75 µm to about 3 µm. A separation distance between the first primary lens assembly and the second primary lens assembly may be in a range of about 5 cm to about 15 cm. For example, the separation distance may be approximately 8 cm.

In some embodiments of this aspect, the system may further comprise a modulated light source configured to illuminate an object. A first counter of the counters of the CPI may be synchronized to the first portion of the light received by the first primary lens assembly, a second counter of the counters of the CPI is synchronized the second portion of the light received by the second primary lens assembly, and a third counter of the counters of the CPI is synchronized to the modulated light source. For example, an up-down count pattern of the first counter may be synchronized to a modulation frequency of the first portion of the light, an up-down count pattern of the second counter may be synchronized to a modulation frequency of the second portion of the light, and an up-down count pattern of the third counter may be synchronized to a modulation frequency of the modulated light source.

According to another aspect of the present technology, an imaging system is provided. The system may comprise a camera configured to capture images of an environment. The camera may include a computational pixel imager (CPI) having a plurality of pixels. Each of the pixels may include: a first counter configured to count up and down at a frequency F1 of a first modulated light source in the environment, such that a periodicity of an up-down count pattern of the first counter is synchronized with the frequency F1; a second counter configured to count up and down at a frequency F2 of a second modulated light source in the environment, such that a periodicity of an up-down count pattern of the second counter is synchronized with the frequency F2; and a third counter configured to count up and down at a frequency F3 of a third modulated light source in the environment, such that a periodicity of an up-down count pattern of the third counter is synchronized with the frequency F3. The frequencies F1, F2, and F3 may be different from each other.

In some embodiments of this aspect, each of the pixels of the CPI may include: a light sensor configured to convert light to photocurrent, and converter circuitry configured to convert the photocurrent to pulses and to provide the pulses to the counters. The converter circuitry may comprise current-to-frequency circuitry, or voltage-to-frequency circuitry, or both current-to-frequency circuitry and voltage-to-frequency circuitry.

In some embodiments of this aspect, the system may further comprise a controller configured to control at least one of the counters independently from at least one other one of the counters.

In some embodiments of this aspect, the camera may be movable within the environment.

In some embodiments of this aspect, the system may further comprise a processor configured to determine a location of the camera in the environment. The first, second, and third modulated light sources may be located at predetermined positions in the environment, and the processor may be configured to determine the location of the camera based on light from the first modulated light source, light from the second modulated light source, and light from the third modulated light source.

In some embodiments of this aspect, the CPI may be configured to produce digital signals and to process the digital signals to produce image data for an image of an object in the environment. Some or all of the pixels of the CPI may be configured to perform a differencing process such that: the first counter rejects a signal from an object illuminated by a light source that is not modulated at the frequency F1, the second counter rejects a signal from an object illuminated by a light source that is not modulated at the frequency F2, and the third counter rejects a signal from an object illuminated by a light source that is not modulated at the frequency F3.

In some embodiments of this aspect, the system may further comprise a laser apparatus configured to project a predetermined light pattern onto an object in the environment. For some or all of the pixels of the CPI, at least some of the counters may be synchronized with a modulation of the predetermined light pattern to enable a detection of a shape of the object by detection of the predetermined light pattern. The laser apparatus may include a laser source modulated at a frequency FL different from the frequencies F1, F2, and F3. In some implementations, some or all of the pixels of the CPI may include counters that reject a signal from an object illuminated by a light source that is not modulated at the frequency FL.

In some embodiments of this aspect, the system may further comprise a laser apparatus configured to project a predetermined light pattern onto an object in the environment. For some or all of the pixels of the CPI, at least some of the counters may be synchronized with a modulation of the predetermined light pattern to enable a detection of one or both of: a change in a position of the object and a change in an environment near the object, by detection of the predetermined light pattern.

In some embodiments of this aspect, the system may further comprise a light source configured to illuminate an object in the environment with modulated light having a frequency greater than 1 MHz. For some or all of the pixels of the CPI, at least some of the counters may be configured to acquire distance data on a distance to the object based on the modulated light returned or scattered from the object. The frequency of the modulated light may be in a range of about 60 MHz to 100 MHz. For example, the frequency of the modulated light may be 70 MHz, or 80 MHz, or 90 MHz. The distance data may comprise in-phase (I) and quadrature (Q) phase signals derived from the modulated light returned or scattered from the object.

In some embodiments of this aspect, the first counters of the pixels of the CPI may be synchronized with the frequency F1 of the first modulated light source to detect data for a first shadow image of the object, the second counters of the pixels of the CPI may be synchronized with the frequency F2 of the second modulated light source to detect data for a second shadow image of an object, and the third counters of the pixels of the CPI may be synchronized with the frequency F3 of the third modulated light source to detect data for a third shadow image of the object. The system may further comprise a processor programmed to determine at least one of: a geometry of the object and a location of the object, based on the first, second, and third shadow images of the object.

According to another aspect of the present technology, a stereo imaging system is provided that may include: a computational pixel imager (CPI) having a plurality of pixels; a plurality of modulated light sources; and an optical assembly configured to receive light from a light field scattered from an object in an environment, and to direct the light to the CPI. The plurality of modulated light sources may include: a first light source modulated at a first frequency F1 and configured to illuminate the environment with first modulated light, and a second light source modulated at a frequency F2 different from the frequency F1 and configured to illuminate the environment with second modulated light. Each of the pixels of the CPI may include: a light sensor and a plurality of counters configured to receive a photocurrent from the light sensor, to convert the photocurrent to a digital signal, and to perform digital signal processing on the digital signal. The optical assembly may include a focusing lens configured to receive the first modulated light scattered from the object and the second modulated light scattered from the object, and to direct the first and second modulated light to form first and second images on sensors of the sensors of the CPI. The CPI may process the first and second modulated light to yield image data for a stereo image of the object.

In some embodiments of this aspect, the system may further comprise an optical filter arranged to filter the first and second modulated light scattered from the object. Alternatively or additionally, the system may further comprise a controller configured to control the first and second light sources and the CPI. In some implementations, the controller may include: a first mode in which the first and second modulated light sources are controlled to illuminate the environment simultaneously, and a second mode in which the first and second modulated light sources are controlled to illuminate the environment separately according to a predetermined temporal pattern. In some implementations, in the second mode, the controller may control the first and second modulated light sources to illuminate the environment in an alternating pattern such that the CPI receives the first modulated light scattered from the object temporally interleaved with the second modulated light scattered from the object.

In some embodiments of this aspect, the CPI may be configured to perform any one or any combination of: processing to subtract data corresponding to the first image from data corresponding to the second image; processing to apply an equal weight to data corresponding to the first image and data corresponding to the second image; and processing to apply a first weight to data corresponding to the first image, and to apply a second weight to data corresponding to the second image, the first and second weights being different from each other.

In some embodiments of this aspect, the CPI may process the first modulated light scattered from the object and the second modulated light scattered from the object such that the image data for the stereo image of the object is spatially filtered and/or temporally filtered.

According to yet another aspect of the present technology, a method of determining a distance to a moving object is provided. The method may comprise an act of scanning an environment using a stereo imaging system that includes: a plurality of light sources; a computational pixel imager (CPI) having a plurality of pixels, each of the pixels of the CPI including a light sensor and electronic circuitry comprising a plurality of counters; and an optical assembly that receives light from the environment and directs the light to the light sensors of the CPI. The method may further comprise acts of: using the electronic circuitry of the pixels to convert photocurrent produced by the light on the light sensors to a digital signal, and to perform digital signal processing on the digital signal to reject data corresponding to one or more stationary objects in the environment; illuminating one or more moving objects with a light modulated at a predetermined frequency F; for at least some of the pixels of the CPI, causing one or more of the counters to be synchronized with the frequency F of the modulated light, such that a periodicity of an up-down count pattern of the one or more counters is synchronized with the frequency F; detecting scattered light from the one or more moving objects, using the CPI to reject a signal corresponding to light that is not modulated to the frequency F, and using to the scattered light to estimate a distance to each of the one or more moving objects in real time or near real time; and outputting distance data for the one or more moving objects.

In some embodiments of this aspect, the distance data may be a moving image or a still image of the one or more moving objects.

In some embodiments of this aspect, the scanning may be performed using an optical scanner rotating at a predetermined frequency. For example, the optical scanner may be a multi-sided mirror device.

In some embodiments of this aspect, the scanning of the environment covers an angular field of view greater than about 45° (e.g., greater than 90° or 120° or 180°). In some implementations, the scanning of the environment may cover an angular field of view of about 250° or greater.

In some embodiments of this aspect, the scanning of the environment may be performed by moving a mirror to direct the scattered light to the CPI.

In some embodiments of this aspect, the stereo imaging system is mounted on a moving vehicle.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, which may be functionally similar and/or structurally similar elements, throughout the various figures. The drawings are not necessarily to scale, as emphasis is instead placed on illustrating and teaching principles of the various aspects of the invention. The drawings are not intended to limit the scope of the present teachings in any way.

FIG. 14A depicts a passive system for obtaining a stereographic image of an object in an environment, according to some embodiments of the present technology;

FIG. 16B depicts an implementation of the stereo imaging system of FIG. 16A, according to some embodiments of the present technology.

The features and advantages of the present invention will become more apparent from the detailed description set forth below when taken in conjunction with the drawings.

DETAILED DESCRIPTION

Figure 1A:
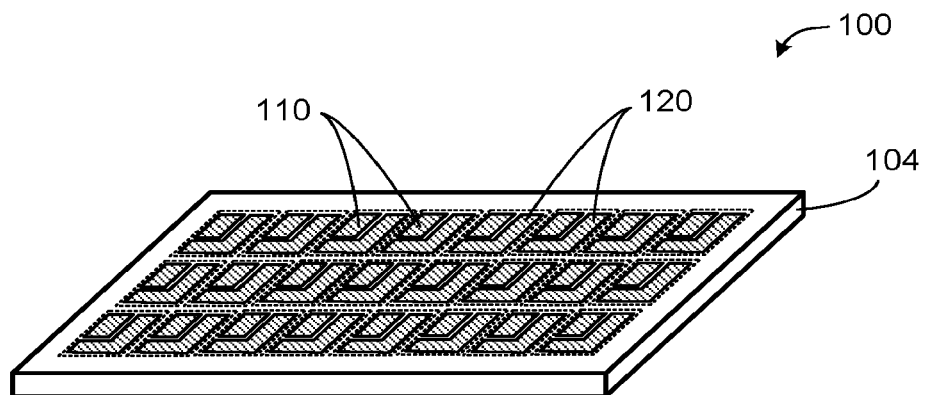
FIG. 1A depicts a CPI, according to some embodiments of the present technology.

Imaging arrays that include in-pixel digitization circuitry are emerging as useful alternatives to conventional analog CMOS and CCD imaging arrays for some applications. An example of a computational pixel imager (CPI) 100 according to some embodiments of the present technology is depicted in FIG. 1A. The CPI 100 may include a substrate 104 on which is formed an array of photodetectors 110 and a corresponding array of pixel integrated circuits (ICs) 120. The pixel ICs 120 are arranged to receive photocurrent signals from the corresponding photodetectors 110. Each photodetector 110 and its corresponding pixel IC 120 may form a pixel, such that the CPI 100 may include a two-dimensional array of pixels. In some embodiments, both the photodetectors 110 and the pixel ICs 120 may both formed on a common substrate (e.g., the substrate 104), as depicted in FIG. 1A. The CPI 100 may comprise tens, hundreds, thousands, or even millions of pixels. In some embodiments, the pixels may be arranged in a one-dimensional array (e.g., in a line), which may be advantageous when the pixels are used for scanning.

Figure 1B:
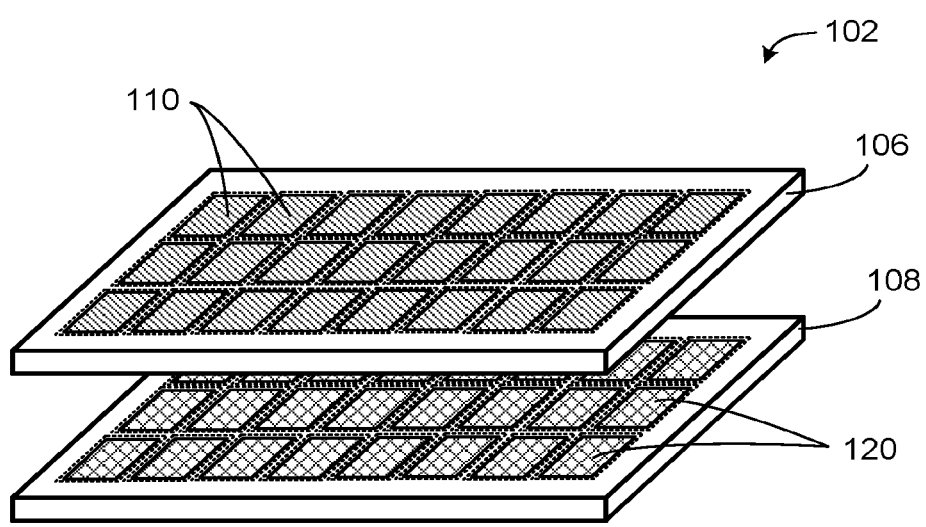
FIG. 1B depicts a CPI, according to some embodiments of the present technology.

FIG. 1B depicts a CPI 102 according to some embodiments of the present technology. In the CPI 102, the photodetectors 110 may be formed on a first substrate 106 and arranged in a detector array, and the pixel ICs 120 may be formed on a second substrate 108 and arranged in a pixel-IC array. In some embodiments, the photodetectors 110 on the first substrate 106 may be directly connected to their corresponding pixel ICs 120 on the second substrate 108 (e.g., by flip-chip or bump-bonding processes, which may include solder bumps or posts). In these embodiments, an area occupied by the pixel IC 120 may be approximately the same size or smaller than an area occupied by the photodetector 110.

In some implementations, the photodetectors 110 on the first substrate 106 may be connected to their corresponding pixel ICs 120 on the second substrate 108 through an interposer (not shown) located between the substrates 106, 108. The interposer may provide some signal rerouting so that the pixel-IC array on the second substrate 108 may be larger or smaller in size than the detector array on the first substrate 106, or when additional area for complex wiring interconnections is required.

The first substrate 106 may be made from a first material that may be the same as or different from a second material used to form the second substrate 108. For example, the first substrate 106 may be made from a first semiconductor material (e.g., indium phosphide (InP)) and the second substrate may be made from a second semiconductor material (e.g., silicon (Si)). Examples of other materials from which the substrates 104, 106, 108 in FIG. 1A and FIG. 1B may be formed, in whole or in part, include: II-VI semiconductors, such as cadmium telluride (CdTe) and mercury-cadmium telluride (HgCdTe); III-V semiconductors, such as gallium nitride (GaN), compositions including GaN, gallium arsenide (GaAs), and compositions including GaAs; and group IV semiconductors, such as Si, germanium (Ge), or silicon-germanium (SiGe). It should be understood that these are non-limiting examples of substrate materials, and other materials not specifically identified herein may be used.

Various detector types may be used for the photodetectors 110 of the CPIs 100, 102. In some embodiments of the present technology, the photodetectors 110 may comprise p-n or p-i-n junction photodiodes or phototransistors or photoconductors. Barrier detectors (e.g., barrier photodiodes, barrier phototransistors, etc.) may also be used in some cases and may provide high detection sensitivity. In some embodiments, the photodetectors 110 may comprise avalanche photodiodes for sensing low light levels. In other embodiments, the photodetectors 110 may comprise microbolometers. In some embodiments, the photodetectors 110 may be cooled to reduce background noise and/or to enhance responsivity of the photodetectors 110. For example, the CPI 100, 102 may be mounted on a thermoelectric cooler or placed in thermal contact with a chilled heat sink or located in a dewar.

Figure 2:
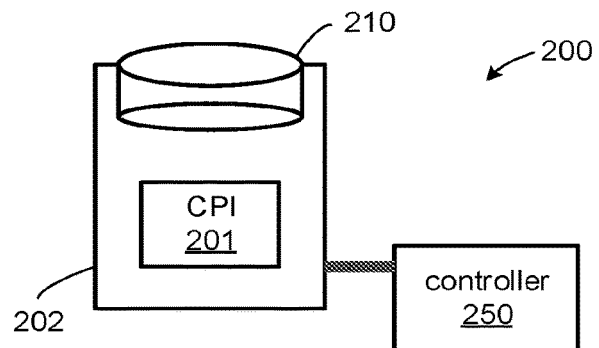
FIG. 2 depicts an imaging system that may include a CPI, according to some embodiments of the present technology.

According to some embodiments of the present technology, a CPI 201 may be included in an imaging system 200, as schematically illustrated in FIG. 2. The imaging system 200 may include a camera 202 that may house collection optics 210 and the CPI 201. The imaging system 200 may also include a controller 250 configured to connect to and control the camera 202 (i.e., to control one or both of: the CPI 201 and the collection optics 210). The controller 250 may be connected to the camera 202 by a wired or wireless data-communication link. The collection optics 210 may include one or more lens(es) and/or mirror(s) that act to form an image of a viewed scene on detectors (e.g., the photodetectors 110) of the CPI 201. The detectors may be located in an imaging plane of the collection optics 210, and an array of pixel ICs (e.g., the pixel ICs 120) may be located in the imaging plane or adjacent to the imaging plane. In some embodiments, one or more component(s) of the collection optics 210 may be moved controllably and automatically, the CPI 201 may be moved controllably and automatically, and/or the entire camera 202 may be moved controllably and automatically (e.g., rotated by motors and/or actuators) to scan and image a large field of view.

The imaging system 200 may be adapted as a visible-radiation imaging system, an infrared-radiation imaging system (e.g., a night-vision system), an ultraviolet-radiation imaging system, or an x-ray-radiation imaging system. The choice of detector design or type and detector material may determine the responsivity of the detectors of the CPI 201 to various wavelengths of radiation. For example, Si-based photodiodes may be relatively more effective for imaging radiation in the visible range of wavelengths (e.g., wavelengths from about 380 nm to about 740 nm), whereas CdTe photodiodes may be relatively more effective for imaging radiation in the ultraviolet range of wavelengths and the x-ray range of wavelengths. As another example, indium arsenide (InAs) and/or HgCdTe photodiodes may be relatively more effective for imaging in the infrared range of wavelengths. In some cases, strained-layer superlattice detectors formed from III-V materials may be used for infrared imaging. In some cases, detector design or type and detector material may be chosen to detect radiation within a spectral range that lies within a portion of an infrared range of wavelength range between about 750 nm and about 5 µm. For example, in some implementations of the present technology, a detector may be selected to detect radiation in an infrared spectral range between about 0.75 µm and about 3 µm. In some implementations, a detector may be selected to detect radiation in an infrared spectral range between about 3 µm and about 5 µm.

The controller 250 may be implemented in various configurations. For example, the controller 250 may be embodied as any one or any combination of: a field programmable gate array (FPGA), a mainframe computer, a microcontroller, a microprocessor, one or more application-specific integrated circuits (ASICs), a digital signal processor, a laptop computer, or desktop computer, a tablet computer, a smart phone, etc. In some embodiments of the present technology, the controller 250 may be embodied as one or more combination(s) of different controlling devices. In addition to hardware, components of the controller 250 may include software (e.g., computer-readable code) and/or firmware that adapts the controller 250 to execute functionalities that control operation of the imaging system 200 to receive, store, transmit, and process image data acquired by the camera 202. The components of the controller 250 also may include custom logic and/or analog circuitry as well as memory that may be used by the CPI 201. The controller 250 may be configured to initiate a transfer of digital signals from pixel ICs (e.g., the pixel ICs 120) of the CPI 201 and to control a shifting operation, a counting operation, and an accumulation time, to enable the pixel ICs to perform digital-signal-processing functions on-chip. In some implementations, some control functions may be performed by the pixel ICs; such control may be via hardwiring to hardware components or implemented as firmware. Such on-chip processing of digital signals may permit an array of the pixel ICs to operate autonomously to perform on-chip digital-signal-processing functions, relatively free of external control. As will be appreciated, the controller 250 may be a single-chip controller.

Some applications of the imaging system 200 according to the technology presented herein may include, for example, industrial inspection, surveillance, process control, biological research, chemical research, pharmaceutical technologies, medical imaging, remote sensing, and astronomy. For example, an implementation that comprises the CPI 201 and a single-chip version of the controller 250 may be incorporated in different types of cameras, including: portable, consumer, still, and motion cameras. In some embodiments of the present technology, the camera 202 may be configured to operate in the visible region of the optical spectrum or in other wavelength regions by selecting appropriate types of photodetectors (e.g., the photodetectors 110) to be included in the detectors of the CPI 201. In some embodiments, the CPI 201 and the controller 250 may be incorporated into a vision system for autonomous vehicles and/or robotic instruments.

With respect to the infrared range of wavelengths, the camera 202 of the imaging system 200 may be adapted for operation as an infrared camera and used for industrial sensing (e.g., to monitor heat emission from industrial components and/or machines), security, and/or firefighting applications, for example. An infrared camera according to some embodiments of the technology described herein may also be employed to provide an infrared image of a scene ahead of and/or around a vehicle (e.g., to determine the vehicle's proximity to one or more other object(s)). For instance, in some implementations, the imaging capability provided by the camera 202 may extend beyond the human visible range of a scene illuminated by the vehicle's headlights. An infrared image obtained via the camera 202 may be displayed, for example, in a "heads up" display worn by the vehicle's driver, or overlaid on a windshield of the vehicle, or displayed on a dashboard display screen of the vehicle, to assist the vehicle's driver. As will be appreciated, potential hazards that are not visible to the unaided eye of a human operator of the vehicle may become visible to the human operator through the camera 202 and one or more on-board display(s) of the vehicle.

In some embodiments of the present technology, the CPI 201 of the imaging system 200 may include a cryogenically cooled array of detectors that detect in the infrared range of wavelengths, with connections between the array and the pixel ICs of the CPI 201 made via indium bump bonding, for example. In such embodiments, the array of detectors may be suitable for low-light-level and/or low-noise sensing of photons having wavelengths in the infrared range of the optical spectrum (i.e., approximately 2 µm to 20 µm). Cooling may also be employed for detectors used to detect photons in the visible range and the ultraviolet range of the optical spectrum.

Figure 3A:
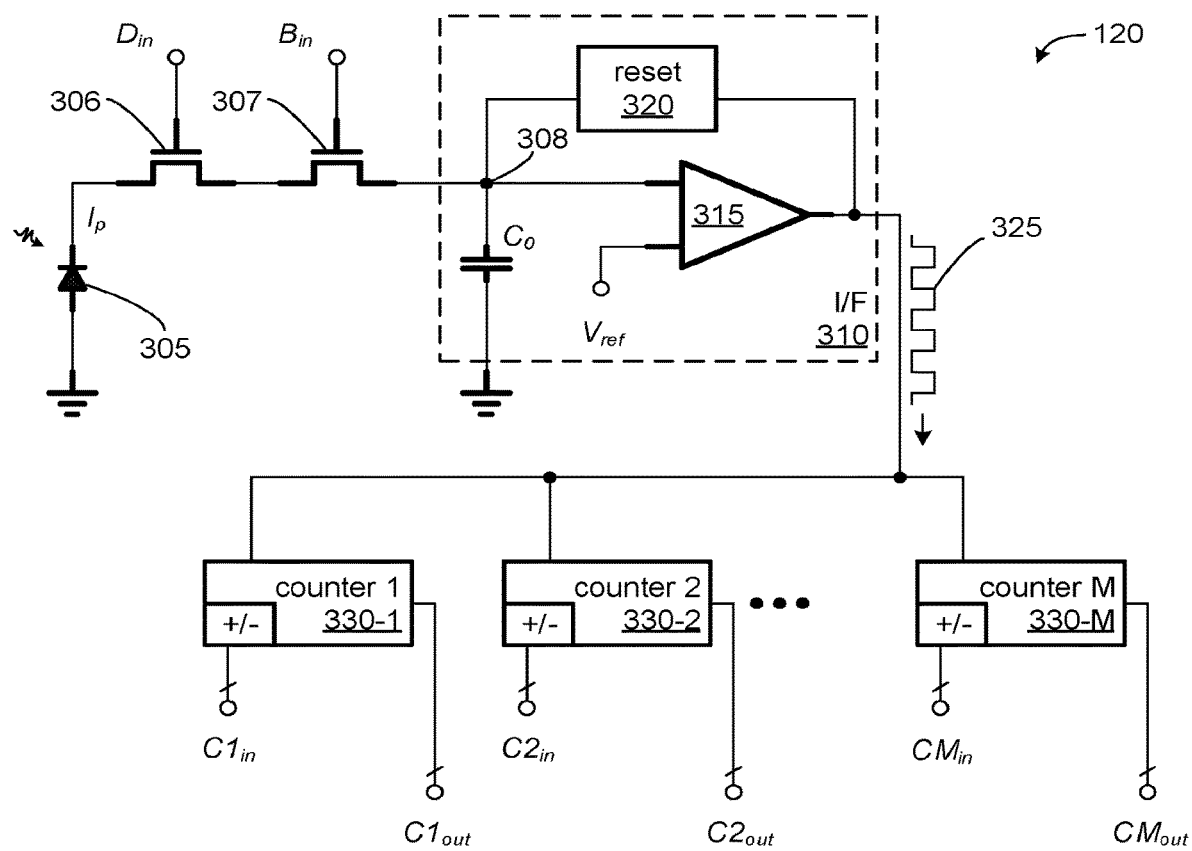
FIG. 3A depicts an example of pixel circuitry for a CPI, according to some embodiments of the present technology.

FIG. 3A schematically depicts an example of the pixel IC 120, according to some embodiments of the technology described herein. The pixel IC 120 may include a first transistor 306, a capacitor $C_0$, which may include a current-to-frequency converter 310, and at least one digital counter 330-1. In some cases, a second transistor 307 may be included between the first transistor 306 and the current-to-frequency converter 310. The second transistor 307 may provide additional isolation between a node 308 or input to the current-to-frequency converter 310 and the source of the first transistor 306. The second transistor 307, connected in cascade, may help dampen noise arising from reset actions performed on the node 308. In some implementations, the pixel IC 120 may include a plurality of M counters 330-1, 330-2, . . . , 330-M, as shown. The current-to-frequency converter 310 may be arranged to receive as input an analog signal and to output a pulse every time a current exceeds a threshold value. The pulses may be counted by the counters 330-1, 330-2, . . . 330-M. In some implementations, a voltage-to-frequency converter may be used instead of a current-to-frequency converter. For example, a voltage-to-frequency converter may be configured to sense a voltage appearing on the node 308 of the capacitor $C_0$ and to output a pulse every time a voltage exceeds a threshold value.

In further detail, the pixel IC 120 may receive a photocurrent $I_p$ generated by a detector 305 (e.g., a photodiode) when the detector 305 is exposed to light or photon radiation. In some embodiments of the present technology, the detector 305 may be a photodiode 305 and may receive a stable bias from a bias source. For example, biasing circuitry may be included to apply a bias to the photodiode 305 from a voltage source. The circuitry may include a large inductor on a bias line to block time-varying signals from the photodiode 305 and pass a DC bias voltage. In some applications it may be advantageous to maintain a stable bias on the detector (photodiode) 305; the second transistor 307 may help reduce bias variations that might otherwise occur due to resetting action(s) at node 308.

In some implementations of the present technology, passage of the photocurrent $I_p$ to the capacitor $C_0$ of the current-to-frequency converter 310 may be controlled by a digital control signal $D_{in}$ applied to the first transistor 306 and/or by a digital control signal $B_{in}$ applied to the second transistor 307, for example. According to some embodiments of the present technology, the control signal $D_{in}$ (and/or $B_{in}$) may determine an exposure period for each pixel of the CPI. For example, when the control signal $D_{in}$ is at a logic "HIGH" or "1" level, the photocurrent $I_p$ may be permitted to flow and to accumulate charge on the capacitor $C_0$, thus raising a voltage at the node 308. Toggling the first transistor 306 and/or the second transistor 307 to a logic "LOW" or "0" level may block further flow of the photocurrent 4, to the capacitor $C_0$, and may terminate an exposure period. As will be appreciated, for video imaging, the exposure period may be repeated, and may be set for any suitable regular duration or regular pattern of durations. In some embodiments of the present technology, the exposure period may be a duration of time in a range between 1 nanosecond (1 ns) (e.g., for high levels of radiation on the detector 305) and tens of minutes (e.g., for low levels of radiation or for high-dynamic-range sensing). An image frame may be formed from each exposure period using signals received from all pixels in the CPI.

In some embodiments of the present technology, the first transistor 306 (or transistors as described further below) may be used to provide gain, and at least one of the transistor(s) 306, 307 may be biased to operate in a sub-threshold region. In such embodiments, the transistor(s) may not be used to shutter an exposure period. Instead, shuttering can be accomplished by control signals (or clock signals) provided to the counters 330-1, 330-2, ... 330-M, to instruct one or more the counters 330-1, 330-2, ... 330-M when to start and stop accumulating counts.

Although the input transistors 306, 307 may be arranged as a switch (as in FIG. 3A) for direct photocurrent injection, in some cases the transistors 306, 307 may be arranged in other configurations. In some embodiments of the present technology, more than transistors may be used to receive photocurrent from the detector 305. For example, one or more transistor(s) may be arranged to amplify photocurrent signals from the detector 305, to provide amplified current to the capacitor $C_0$ and the current-to-frequency converter 310. Input transistor(s) may be connected as a source-follower or a transimpedance amplifier, or may be configured for buffered direct injection of the photocurrent $I_p$. In some implementations, a current mirror circuit may be may be included in an input transistor arrangement to provide current gain in a circuit branch that runs parallel to a branch containing the detector 305 and the first transistor 306.

Although the input transistors 306, 307 are each depicted as a field-effect transistor (FET) in FIG. 3A, it should be understood that other types of transistors (e.g., bipolar junction transistors (BJTs)) may be used in some embodiments.

The capacitor $C_0$ may have one terminal connected to an output of the first transistor 306 (or the second transistor 307, if present) and a second terminal connected to a reference potential (e.g., ground, as illustrated). The capacitor $C_0$ may have a small capacitance (e.g., between 1 femtoFarad (1 fF) and 1 nanoFarad (1 nF)), in some embodiments of the present technology; in other embodiments, higher or lower values of the capacitance may be used. In some cases, the capacitor $C_0$ may be embodied as a parasitic capacitance of a discrete circuit device (e.g., a parasitic drain capacitance of the first transistor 306 or the second transistor 307, if present), and may not be a separate discrete component in the pixel IC 120. For each pixel of the CPI, the capacitor $C_0$ of the pixel may determine a value of a least significant bit (LSB) for a signal level from the pixel. Although FIG. 3 depicts one polarity for applying (sourcing) current to the current-to-frequency converter 310, in some cases it may be beneficial to reverse an orientation of the detector 305 (e.g., a photodiode) and sink current from the current-to-frequency converter 310. The use of appropriate types (n-MOS or p-MOS) of transistors may allow a pixel IC to accommodate a current source for a current-sink photo-detection strategy. Current applied to the current-to-frequency converter 310 may charge or discharge the capacitor $C_0$. For example, in some cases, a reset of the capacitor $C_0$ may comprise applying a non-zero voltage to the node 308, which may leave a potential across the capacitor $C_0$ that may be discharged, at least in part, by subsequent exposure of the detector 305.

The current-to-frequency converter 310 may include comparator circuitry 315 and reset circuitry 320, according to some embodiments of the present technology. The comparator circuitry 315 may be embodied as a Schmitt trigger, a comparator, or a high-gain amplifying transistor that toggles between two output states (e.g., from a low level to a high level, or from a high level to a low level) when an input voltage exceeds (or falls below) a reference voltage $V_{ref}$. In some implementations, the reference voltage $V_{ref}$ may be hardwired to a fixed value or may be a threshold voltage of a transistor. In other implementations, the reference voltage $V_{ref}$ may be programmable by an external control signal to two or more values. For example, the pixel IC 120 may include transistors (and resistive elements, in some cases) arranged to provide programmable voltage values. The reset circuitry 320 may be embodied as one or more transistors arranged to discharge the capacitor $C_0$ (e.g., to shunt a first terminal of the capacitor $C_0$ connected to the node 308) to the reference voltage $V_{ref}$ connected to a second terminal of the capacitor $C_0$. For example, a toggling of an output from the comparator circuitry 315 may activate the reset circuitry 320 to discharge the capacitor $C_0$, which may cause the comparator circuitry 315 to toggle back to a prior state of the two output states. In some implementations, the current-to-frequency converter 310 may be embodied as described in connection with FIG. 3 of U.S. Pat. No. 10,348,993, the entire contents of which is incorporated herein by reference.

As a result of toggling of the comparator circuitry 315 and an associated resetting of the capacitor $C_0$, an output of pulses 325 may be provided to one or more of the counters 330-1, 330-2, ..., 330-M during an exposure period. The number of pulses outputted during an exposure period will depend upon and be proportional to an amount of radiation (i.e., photons) incident on the detector 305. As will be appreciated, a higher fluence of radiation will produce a larger number of pulses during an exposure period, and the number of pulses may vary from exposure period to exposure period during video imaging. The one or more of the counters 330-1, 330-2, . . . , 330-M may accumulate counts for the pulses received during the exposure period, and, at the end of the exposure period, the number of counts may be read out of the counter(s) as a digital signal level for the pixel corresponding to the counter(s). The digital signal level may be used to indicate an intensity of radiation received by the detector 305 of the pixel.

The counters 330-1, 330-2, . . . , 330-M may be implemented with transistors arranged as logic gates, according to some embodiments of the technology described herein. For example, each of the counters 330-1, 330-2, . . . , 330-M may be formed from flip-flop logic circuits and embodied as an N-bit ripple counter. As will be appreciated, the counters 330-1, 330-2, . . . , 330-M may be formed of other circuitry, and may be embodied as other types of counters (e.g., synchronous counters). Accumulated counts may be output from the counters 330-1, 330-2, . . . , 330-M over digital data lines $C1_{out}$, $C2_{out}$, . . . , $CM_{out}$, which may be arranged in parallel, as shown in FIG. 3. In some embodiments, count values from the counters 330-1, 330-2, . . . , 330-M may be provided to shift registers that are respectively connected to the counters 330-1, 330-2, . . . , 330-M. For example, the shift registers connected to the counters 330-1, 330-2, . . . , 330-M of a pixel may be located in the pixel and may form part of the pixel IC 120 of the pixel. In some cases, the counters 330-1, 330-2, . . . , 330-M themselves may be configured for additional use as shift registers. A bit size of the counters 330-1, 330-2, . . . , 330-M may determine a most significant bit (MSB) limit on signal values from the pixel.

According to some embodiments, the counters 330-1, 330-2, . . . , 330-M may be programmable via the digital input lines $C1_{in}$, $C2_{in}$, . . . , $CM_{in}$. For example, the counters 330-1, 330-2, . . . , 330-M may be programmed to increment or decrement counts at the start of each exposure period. In some implementations, a counting direction may be changed by a programmable control signal at any time during an exposure period. Additionally or alternatively, the counters 330-1, 330-2, . . . , 330-M may be programmed to have an initial count value at the start of each exposure period.

Figure 3B:
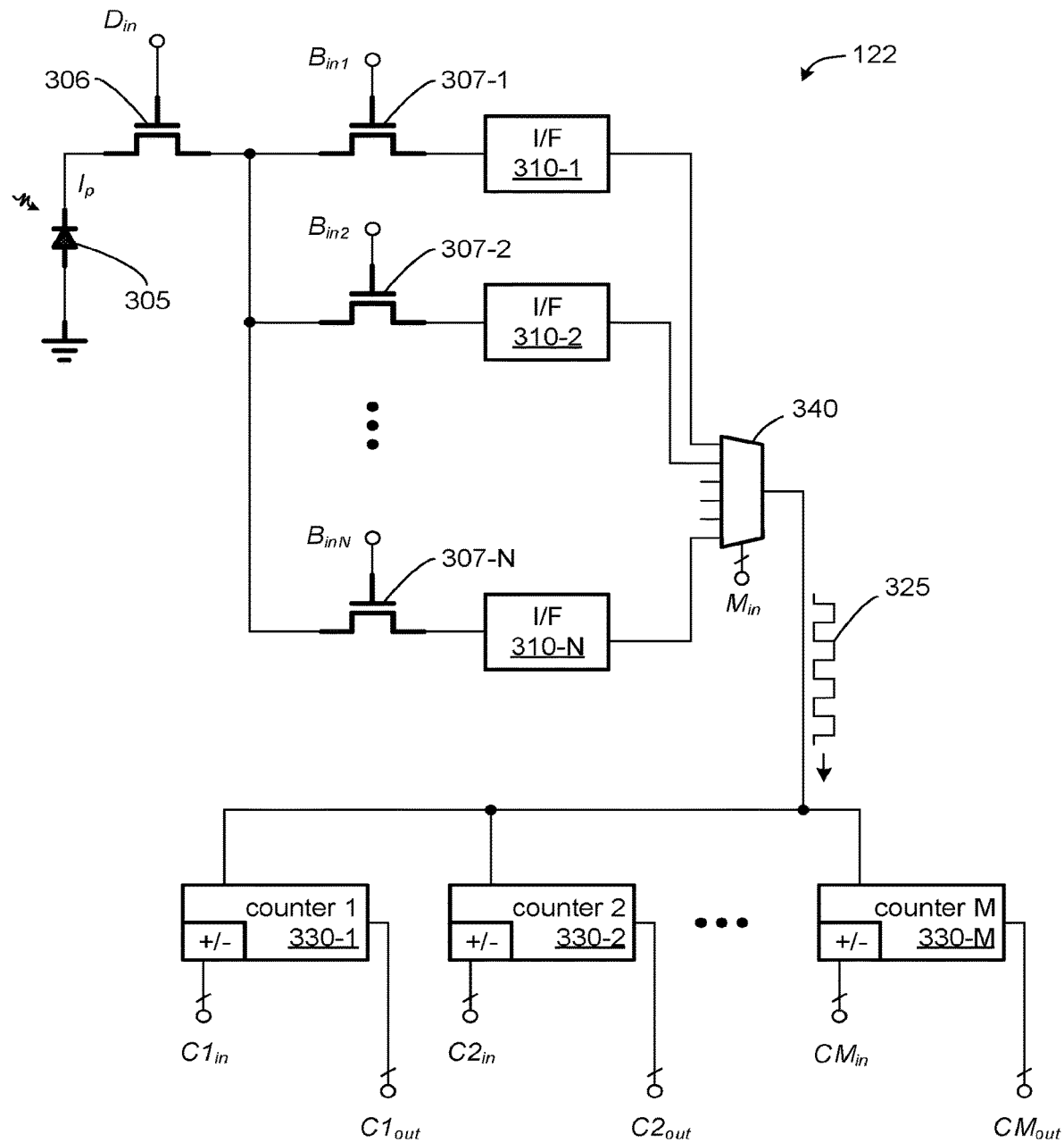
FIG. 3B depicts an example of pixel circuitry for a CPI, according to some embodiments of the present technology.

Embodiments described herein are not limited to one current-to-frequency (or voltage-to-frequency) converter per pixel. Two or more converters may be used per pixel IC 122, as illustrated in the example of FIG. 3B. According to some embodiments, one or more pixels of a CPI may include two or more current-to-frequency converters 310-1, 310-2, . . . 310-N arranged to receive an output from the pixel's detector 305, which may be a photodiode 305 in the illustrated example. In some cases, there may be N second transistors 307-1, 307-2, . . . 307-N, where N is a positive integer. The N second transistors may be used to provide added isolation of the pixel's detector (the photodiode 305) from resetting actions occurring in the current-to-frequency (or voltage-to-frequency) converters. Additionally, the N second transistors 307-1, 307-2, . . . 307-N may be used to select one or more of the converters 310-1, 310-2, . . . 310-N for processing of the signal from the photodiode 305. The converters may be as described above in connection with FIG. 3A, and their description may be found above.

According to some embodiments of the present technology, outputs from the converters 310-1, 310-2, . . . 310-N may connect to a multiplexer 340 that may be controlled with a digital control signal $M_{in}$ inputted to a control port. The control signal $M_{in}$ may select which input port connects to an output port of the multiplexer 340. In some implementations, the multiplexer 340 may be a N:1 multiplexer. FIG. 3B illustrates an example case in which the pixel's counters 330-1, 330-2, . . . 330-M may be shared by (e.g., dynamically assigned to) any of the converters 310-1, 310-2, . . . 310-N. In some cases, the multiplexer 340 may not be used for some or all of the converters, and one or more of the converters may have separate counter(s) that are dedicated or statically assigned to each converter. Other circuit arrangements are also possible. For example, a first group of counters or a single counter in a pixel may be dedicated to one converter or shared by a first group of converters, and a second group of counters or a second single counter in a pixel may be dedicated to one converter or shared by a second group of converters.

Adding additional converters may provide redundancy in pixels and improve fabrication yields. For example, if one of the converters fails in a pixel due to, e.g., a microfabrication process defect, another converter can be selected for the pixel so that all pixels in the array of pixel integrated circuits can be used. In some implementations, the converters 310-1, 310-2, . . . 310-N within a pixel may be configured differently (to exhibit different gain, frequency characteristics, power consumption, capacitance value for capacitor $C_0$, etc. This may provide improved coverage with the same CPI for different signal conditions and operating conditions, including, e.g., gain, noise, power, and maximum detectable frequency modulations.

Adding additional converters and counters may also support multi-thread processing operations described herein. For example, a signal from a pixel's detector (e.g., photodiode 305) may be processed by one, two, or more converters and two or more counters (which may be in separate groups of counters), such that different functional operations may be performed on parallel computational threads with the pixel's counters. Some of the functional operations may include bit operations such as to, e.g., add, subtract, complement, shift, compare, and rotate.

Figure 4:
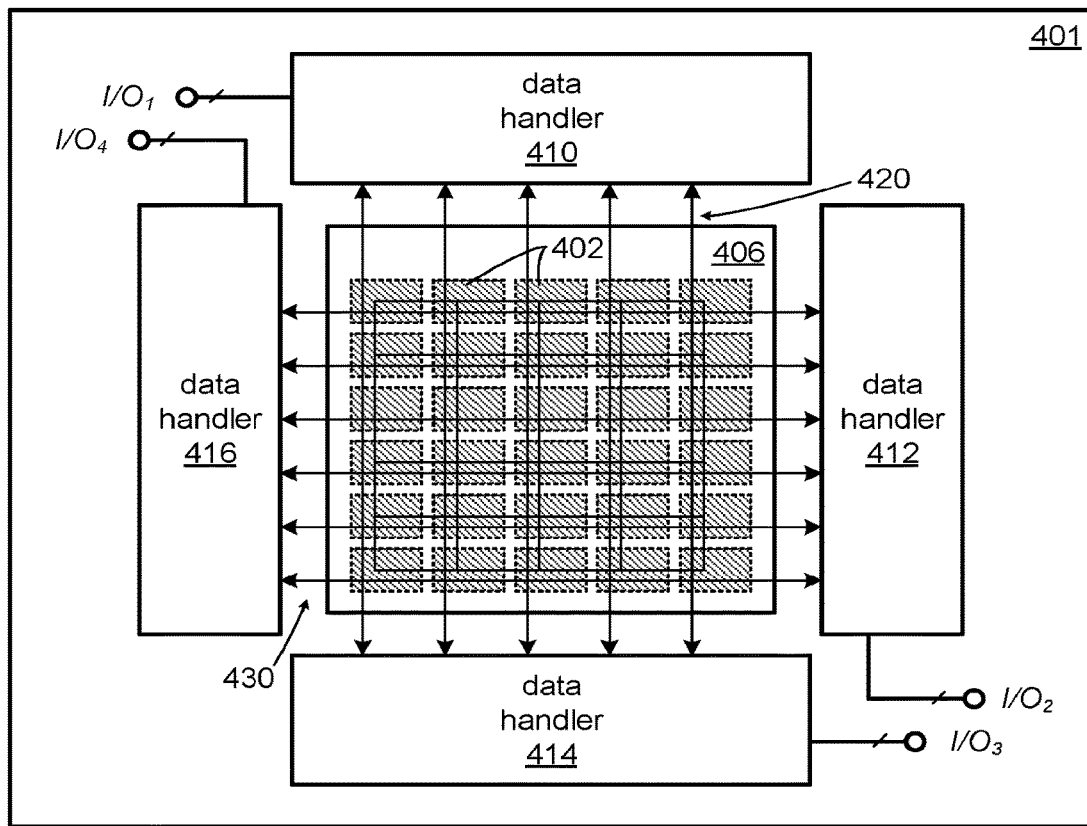
FIG. 4 depicts additional data-handling circuitry that may be used with a CPI, according to some embodiments of the present technology.

FIG. 4 schematically depicts a CPI 401 that includes an array 406 of pixel ICs and additional data-handling circuitry. In some embodiments of the present technology, the CPI 401 may include circuitry that permits an orthogonal transfer of accumulated count values on counters throughout the array 406 of pixel ICs. The orthogonal transfer may be accomplished by shifting count values from a pixel IC's counter(s) to one or more counter(s) of any one of the pixel IC's nearest-neighbor pixels ICs (e.g., one of the four adjacent pixel ICs bordering the pixel IC from which the counts are being shifted out), as described further below. For illustrative purposes, each shaded rectangle 402 within the array 406 represents approximately an area occupied by a pixel, although in an actual device there may be thousands to millions of pixels. According to some implementations of the present technology, digital counts may be transferred through column-transfer data lines 420 and/or through row-transfer data lines 430 to other pixels or to data handlers 410, 412, 414, 416 in, e.g., north, south, east, west directions. In some implementations, multiplexers may be included to serialize data (e.g., data from multiple column-transfer data lines 420 and/or multiple row-transfer data lines 430) that is sent to the data handlers 410, 412, 414, 416 and/or that is sent off-chip. For example, one or more M:1 multiplexers (where M can be any integer value of 2 or greater) may be used to serialize data from multiple row-transfer data lines 430 onto one or more single data line(s) that provide pixel data to one or more of the data handlers.

By shifting data along rows or columns, any result or count value from a counter within the array 406 may be transferred to another counter in a different pixel within the array 406 or to the data handlers 410, 412, 414, 416. The ability to transfer counts, along with the ability to program the counters 330-1, 330-2, . . . , 330-M (e.g., to increment and decrement) and the ability to control count accumulation times permits a range of digital signal processing operations to be performed within the array 406. For example, the digital signal processing operations that may be performed within the array 406 may include but are not limited to: threshold filtering, high-pass filtering, low-pass filtering, edge-detection filtering, match filtering, spatial filtering, temporal filtering, spatio-temporal filtering, smoothing, differentiation, data compression, time-domain integration, image correlation, and convolution.

For example, match filtering may be implemented by developing a filter kernel for cross correlation with objects in an imaged scene (e.g., a person's iris imaged by a personal identity system; a face imaged by a facial recognition system; a target object imaged by an observatory imaging system; etc.). Convolution of a kernel with an image (e.g., to filter the image) may be implemented as a series of count accumulations (which may increment and/or decrement counts) and orthogonal transfers of count values. A correlated or convolved image may then be thresholded by using compare logic for one or more detection(s) (e.g., detection of an iris, a face, a target object, etc.). Data from the array 406 may be raw results from cross-correlation or from convolution, or may be only data associated with the detection(s) alone, which could reduce the amount of data transmitted and subsequently processed.

In another example, a signal from a steering and/or motion-sensing mechanism may be used to shift accumulated counts in the array 406 synchronously with an overall motion of an imaging system in which the array 406 is used, to enable time-domain integration. Similar control of shifting counts may also enable image stabilization for environments where the imaging system may undergo unwanted vibrations. In some embodiments of the present technology, correction of non-uniformities in the array 406 may be performed by configuring or controlling counters of the array 406 to count down for a frame period while viewing a flat, extended source (e.g., a mechanical shutter), to acquire a background scene. After the background scene has been acquired, the counters may be configured or controlled to count up while a current scene data is being acquired. Thus, after a frame period, only signal data and noise data may be present, and any systematic non-uniformity of the array 406 will be cancelled. For example, such correction of non-uniformities may employ a 50% duty cycle for current-scene acquisition and background scene acquisition.

In some embodiments of the technology described herein, there may be more than one column-transfer data line 420 and more than one row-transfer data line 430 per pixel, so that data from multiple counters within a pixel may be transferred in parallel to multiple counters in one or more adjacent pixels. For example, a count value from a first counter in a first pixel may be transferred to a first counter in an adjacent pixel while a count value from a second counter in the first pixel may be transferred to a second counter in another adjacent pixel. In some cases, data serializers may be included in each pixel IC to send count values from multiple counters within the pixel IC serially over a signal row and/or column-transfer data line.

In some embodiments of the present technology, the data handlers 410, 412, 414, 416 may comprise additional transistor circuitry configured to provide functionality for additional data-processing operations and/or control of data transfer and programming of pixel ICs (e.g., the pixel ICs 120) of the array 406. For example, the data handlers 410, 412, 414, 416 may include additional registers and data serializers to read data from and onto the row and column data-transfer lines 430, 420. The data handlers 410, 412, 414, 416 may also include logic gates to enable control of: a duration of an exposure period, a count direction of a counter, and/or a value of the threshold voltage reference $V_{ref}$. In some implementations, the data handlers 410, 412, 414, 416 may be configured to perform any one or any combination of the following functions: threshold detection, compare, match filtering, and data selection. In some implementations, the data handlers 410, 412, 414, 416 may be configured to determine a read-out time for selected rows and/or selected columns (as may be used in connection with infinite dynamic range pixels, described below, for example). The data handlers 410, 412, 414, 416 may also include input/output data lines $I/O_1$, $I/O_2$, $I/O_3$, $I/O_4$, which may be used, for example, to send processed or unprocessed signals to an external analyzer or processor for further data analysis and processing. In some implementations, one or more of the data handlers 410, 412, 414, 416 may be located on a same chip as the array 406. In other implementations, one or more of the data handlers 410, 412, 414, 416 may be located on a different chip that is connected to the chip containing the array 406. According to some embodiments, the array 406 and the data handlers 410, 412, 414, 416 may be manufactured using complimentary metal-oxide-semiconductor (CMOS) microfabrication processes.

Figure 5A:
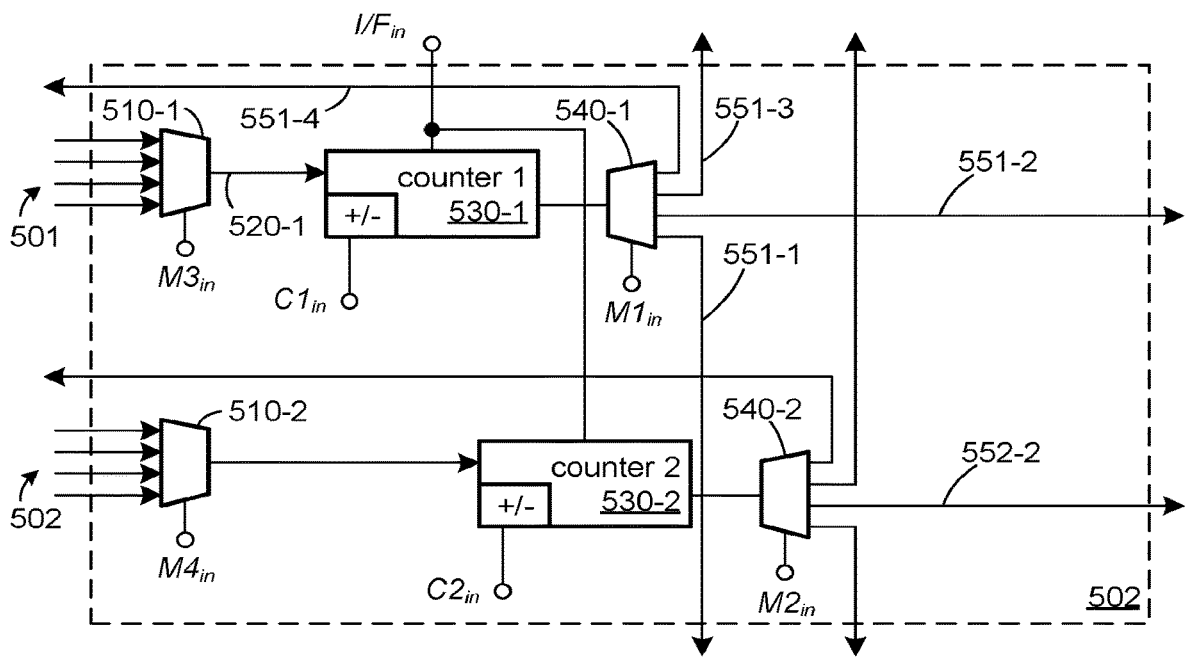
FIG. 5A depicts an example of counter connections across pixels, according to some embodiments of the present technology.

FIG. 5A illustrates an example of how multiple counters 530-1, 530-2 in a pixel 502 of a CPT (e.g., the CPT 401) may be connected to counters in adjacent pixels. Although only two counters are illustrated within the pixel 502, it should be understood that pixels of the CPI may include more than two counters, in some implementations of the present technology. Additional counters may be connected in a same way to counters in adjacent pixels. In some implementations, the counters can be ripple counters. In other implementations, other types of counters may be used. In some cases, the counters may be implemented with D flip-flops for each bit, and the flip-flops may be connected in series with an output of one flip-flop connected to an input of a next flip-flop. Further details of counters and associated circuitry that may be used in the implementations depicted in FIG. 5A and FIG. 5B may be found in U.S. Pat. No. 9,768,785 as described in connection with FIG. 3 and FIG. 4 of that patent, which is incorporated herein by reference in its entirety.

According to some embodiments of the present technology, multiple counters of a pixel (e.g., the pixel 502) of an array may be connected to counters of a neighboring pixel in a way such that counters operated in a particular manner for image acquisition or performing a signal-processing function may shift count values to other counters anywhere in the array that are operated in the same manner. In some implementations, the shifting of counter values may be through nearest neighbor shifts. For example, a first counter 530-1 operated in a first manner in the pixel 502 may shift its count value to a first counter operated in a same manner in a first nearest neighbor pixel, whereas a second counter 530-2 operated in a second manner in the pixel 502 may shift its count value to a second counter operated in a same manner in a second nearest neighbor pixel. The first nearest neighbor pixel may be the same as or different from the second nearest neighbor pixel. That is, the pixels of an array need not all be the same. An example of a first manner of counter operation may be for raw image acquisition, where the corresponding first counters may continuously count up during an exposure period. An example of a second manner of counter operation may be temporal filtering, to detect changes in pixel values by modulated signals of moving objects, where a count value may be incremented for half an exposure period and then decremented for half an exposure period. Other manners of counter operation are possible, as described above and below. By repeated nearest-neighbor shifts, along rows and columns, a value on one counter may be shifted to another corresponding counter anywhere in the array.

For the example depicted in FIG. 5A, the counters may be configured to function as both counters and shift registers. Counter values from multiple counters 530-1, 530-2 in the pixel 502 may be passed over separate data lines (e.g., row-shift data lines 551-2, 552-2) to multiple corresponding counters in an adjacent pixel. Counter values may be passed to adjacent pixels in either direction within a row or a column along different data lines (e.g., data-shift lines 551-1, 551-2, 551-3, 551-4). Additionally, counter values for pixels at an edge of the array may be passed to edge logic circuitry for read-out and/or data processing. The data-shift lines may be parallel data lines (such that count values are passed in parallel) or serial data lines. For serial transmission of count values, b:1 multiplexers for b-bit counters may be included in the pixel 502 downstream of a counter output to place count values serially onto the data-shift lines. In some embodiments, shift multiplexers 540-1, 540-2 may be included in the pixel 502, each connected to a corresponding counter output, and each controlled by signals applied to inputs $M1_{in}$, $M2_{in}$ from edge logic circuitry to direct counter values to one of the neighboring pixels. Similarly, input multiplexers 510-1, 510-2 may be connected to data inputs of the counters 530-1, 530-2 to receive and place count values from counters of neighboring pixels onto the counters 530-1, 530-2 within the pixel 502. The input multiplexers 540-1, 540-2 may also be controlled by signals applied to inputs $M3_{in}$, $M4_{in}$ from edge logic circuitry.

Figure 5B:
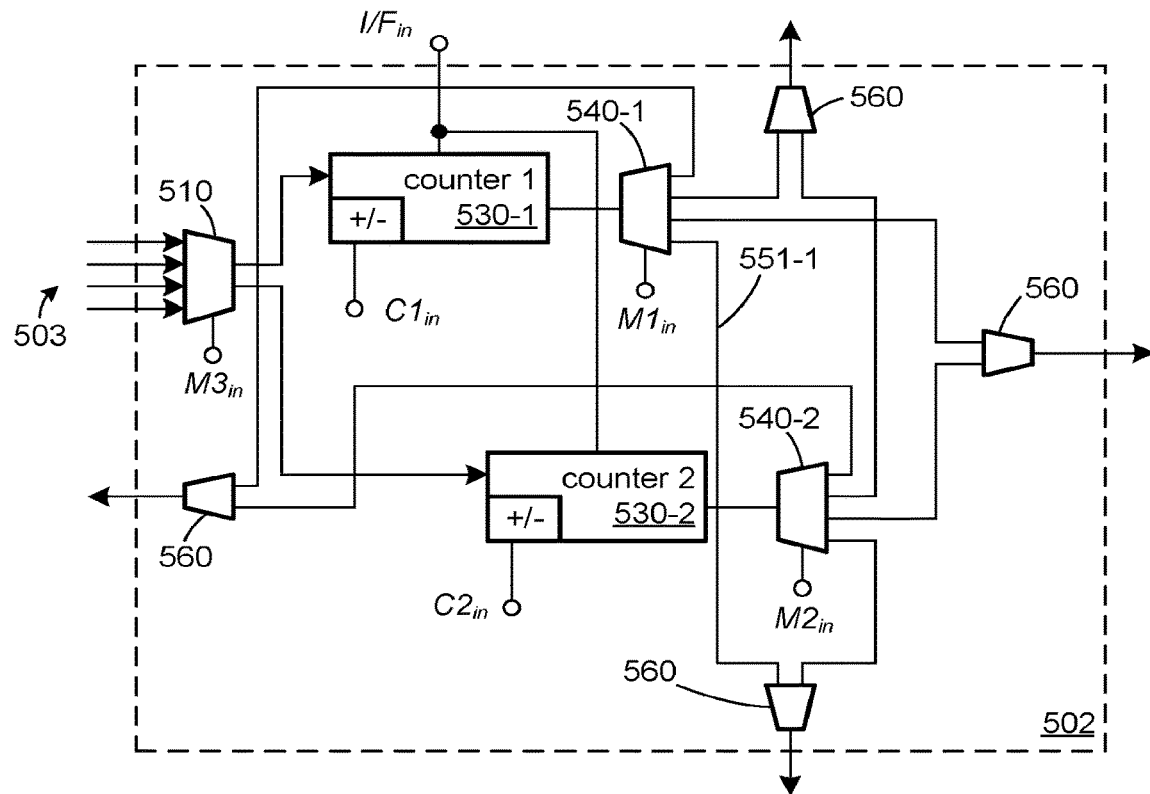
FIG. 5B depicts another example of counter connections across pixels, according to some embodiments of the present technology.

FIG. 5B illustrates another example of inter-pixel counter connections. In some embodiments of the present technology, values from multiple counters within the pixel 502 may be multiplexed onto a same row-shift or column-shift data line with counter-output multiplexers 560. The counter-output multiplexers 560 can be M:1 multiplexers, where M is an integer value of 2 or greater and corresponds to the number of independently controlled counters within the pixels. Additionally, data received from adjacent pixels may be received by a single input multiplexer 510. The input multiplexer 510 can be a 4:M multiplexer, where M is an integer value of 2 or greater and corresponds to the number of independently controlled counters within the pixel 502.

Figure 6:
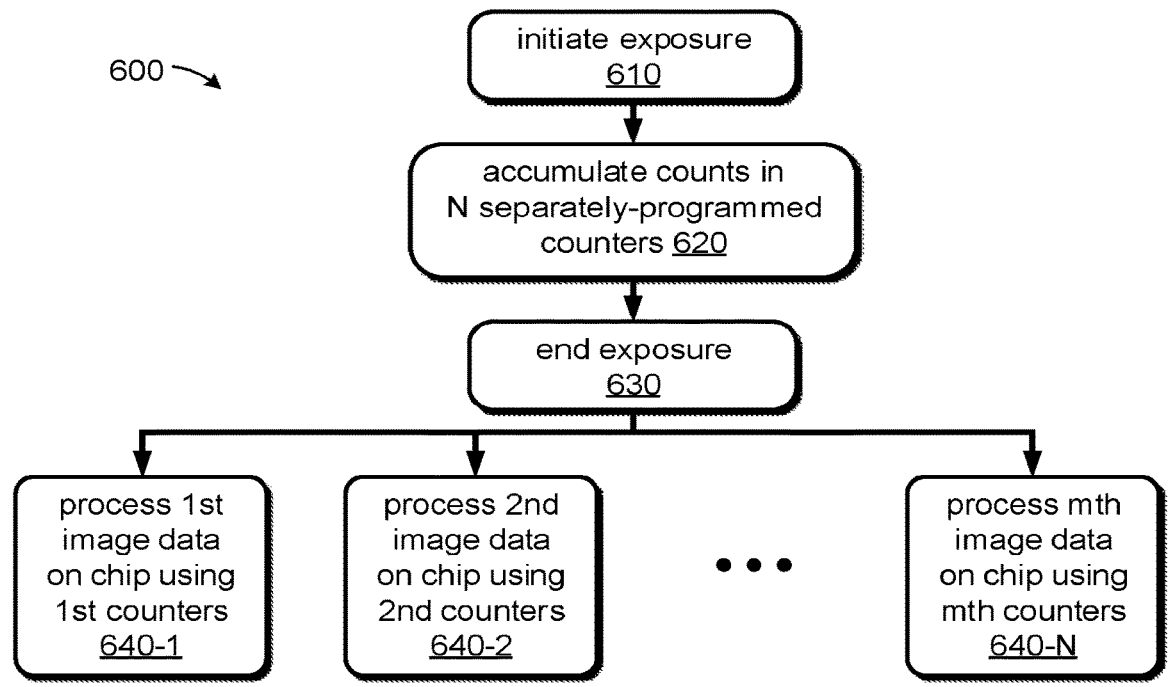
FIG. 6 illustrates acts associated with multi-thread processing of image data acquired by multiple counters, according to some embodiments of the present technology.

FIG. 6 illustrates a flow of an example method of multi-thread processing 600 that may be performed with an array of pixel ICs (or pixels) having multiple counters in each pixel and arranged to shift values to corresponding counters in adjacent pixels, as described above. According to some embodiments of the present technology, the method 600 may include an act 610 of initiating an exposure of a detector array of a CPI to generate image data. During an exposure period (e.g., an acquisition period for acquiring a signal that may be used to form an image frame), at act 620, multiple counters in each of a plurality of pixels may accumulate count values. The count values for at least some of the counters may be accumulated independently of count values accumulated by counters of other pixels, and may even differ from count values accumulated by other counters within a same pixel. In some implementations, the counters within the same pixel may be programmed to operate differently. For example, two counters within the same pixel may be programmed to increment and decrement counts periodically at a same frequency but with phases shifted by 90° for in-phase and quadrature (I-Q) detection of a modulated optical signal, whereas a third counter in the same pixel may be programmed to increment counts for one-half of an exposure period and to decrement counts for another one-half of an exposure period to detect non-stationary objects in a scene being imaged. At act 630, accumulation of counts in counters may terminate when and exposure is terminated, ending the exposure period. In some cases, one or more counters within a pixel may be programmed to accumulate counts in response to exposure of the pixel's detector, whereas one or more other counters within the pixel may be programmed to perform other operations on data previously accumulated or provided to the counter(s) (e.g., shift operations, bit rotation operations, ones complement, addition, subtraction, compare, read-out, data receive, etc.). Such different in-pixel operations on the counters may be in response to multiple threads that execute simultaneously in the system.

After the exposure period has ended and counts have been accumulated in multiple counters, two or more independent data-processing operations may be executed on multiple threads simultaneously with the array of pixel ICs. For example, first image data (first counter values) acquired with first counters from the pixel ICs may be processed (act 640-1) using shift operations using shift operations and/or any of the above counter operations to perform a first signal-processing function (e.g., spatial filtering). Additionally, second image data (second counter values) acquired with second counters from the pixel ICs may be processed (act 640-2) using shift operations and/or any of the above counter operations to perform a second signal-processing function (e.g., temporal filtering). In some implementations, the different signal-processing functions may be performed, at least in part, while count values are being accumulated in a subsequent exposure period (as may be the case for functions such as: convolution, correlation, time-domain integration (e.g., for a deterministically moving camera), and image stabilization). In some cases, raw count values may be accumulated as new image data on one or more counters in a pixel IC while signal processing operations are being performed with other counters of the pixel IC, such that the CPI may have essentially no dead time in imaging a scene or successive scenes.

As indicated in FIG. 6, the multiple execution threads (acts 640-1, 640-2, . . . 640-N) may execute simultaneously. For imaging systems in which outputs and inputs of multiple counters are connected across pixels with separate, parallel data-shift lines (e.g., lines 551-2, 552-2 illustrated in FIG. 5A), at least some signal-processing operations for different counters performing different functions may occur at a same time (e.g., on same clock cycles that drive data transfer or arithmetic operations). For imaging systems in which outputs and inputs of multiple counters are connected across pixels using multiplexers to serialize counter data onto shared data-shift lines (as illustrated in FIG. 5B), at least some signal-processing operations for different counters performing different functions may be interleaved in time and may occur on alternating clock cycles. In either case, multiple execution threads (acts 640-1, 640-2, . . . 640-N) may execute concurrently on a pixel IC of the array (e.g., the array 406). When one or more of the multiple execution threads are completed, data for the corresponding counters may be read out of the array over the column-transfer data lines (e.g., the lines 420) and/or row-transfer data lines (e.g., the lines 430) for display, analysis, storage, and/or further signal processing.

In some embodiments of the technology described herein, a CPI as described above (e.g., the CPI 100, 102, 401) may include counters that are configured for infinite dynamic-range sensing. As will be appreciated, the dynamic range of an image sensor describes the difference between the brightest object and the dimmest object that can be detected and discerned in an image. Conventional approaches to digital imaging typically cannot achieve high dynamic ranges, such as over three or four orders of magnitude, for example. Digitizing in-pixel, as is done for the CPIs described above, may improve dynamic range over that of conventional digital imaging sensors without in-pixel digitization. However, digitizing in a pixel to achieve high dynamic ranges may present challenges when trying to implement an array of imaging pixels having small pixel sizes. For example, the size of counters may need to be increased in order to achieve a high dynamic range. Use of advanced CMOS processes may enable transistor size (and consequently counter size) to be reduced, but such advanced microfabrication processes may be prohibitively expensive in some instances. Other approaches to reducing the size of digital-imaging pixels (e.g., to a feature size of 10 μm or smaller) are desirable, to reduce the size, weight, and power (SWaP) of imaging sensors and imaging devices. The inventors have recognized and appreciated techniques in which finite-bit counters (e.g., an 8-bit counter) may be configured for unlimited dynamic range.

Figure 7A:
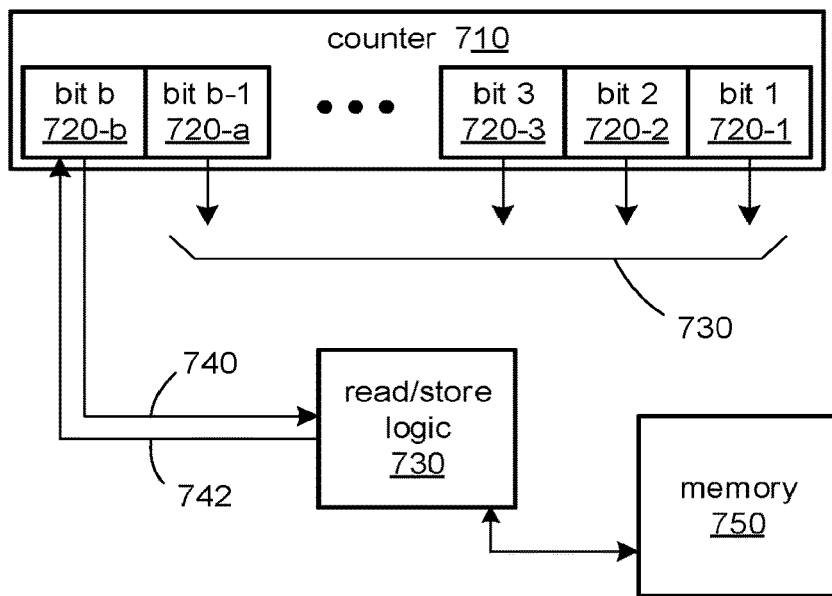
FIG. 7A depicts example circuitry for infinite-dynamic-range sensing in a pixel, according to some embodiments of the present technology.

An example of circuitry for an infinite-dynamic-range counter 710 is depicted in FIG. 7A, according to some embodiments of the present technology. As shown, circuitry for the infinite-dynamic-range-counter 710 may include a b-bit counter, read/store logic 730 that is in operative communication with the counter 710, and memory 750 that is in operative communication with the read/store logic 730. The counter 710 may comprise any type of counter described above, such as a ripple counter, a synchronous counter, as well as other types of counters. The read/store logic 730 may be embodied as processing logic that may be located on-chip or off-chip and that may be configured to determine when to read a most significant bit (MSB) or a group of MSBs of one or more counter(s) of a CPI (e.g., the CPI 100, 102, 401) and to store in the memory 750 information for each of the counters indicating that the counter has rolled-over in count value one or more times. In some cases, the read/store logic 730 may be implemented as on-chip logic gates or field-programmable gate arrays located within each pixel of the CPI, or located at an edge of an array (e.g., the array 406), such as in one or more of data handlers (e.g., the data handlers 410, 412, 414, 416).

According to some embodiments of the present technology, the infinite-dynamic-range counter 710 may comprise a b-bit counter in which a MSB 720-$b$ is interrogated differently than lower bits 720-1, 720-2, ..., 720-$a$. A size of the counter (i.e., a value of b) may be any integer value of 2 or greater. In some implementations, the size of the counter may be between 3 bits and 25 bits. In various embodiments, the MSB 720-$b$ may be interrogated at a higher read-out rate than the lower bits 720-1, 720-2, ..., 720-$a$. For long exposure periods and/or high signal levels, counters in some pixels of the CPI may reach their maximum count value and roll-over to a value of 0 and continue counting up. If the roll-over is undetected, signal information may be lost. By reading out the value(s) of the MSB 720-$b$ or group of MSBs (e.g., the MSB 720-$b$ and one or more other bit(s)) at a higher rate than the lower bits, a roll-over event may be detected and recorded, so that subsequent image data read out for all bits of the counters may be corrected to reflect accurate signal levels. As will be appreciated, a group of MSBs may be a counter's MSB (e.g., bit b) and the next N lower bits (e.g., bits b−1, b−2, ... b−N) where N is a positive, non-zero integer.

Figure 7B:
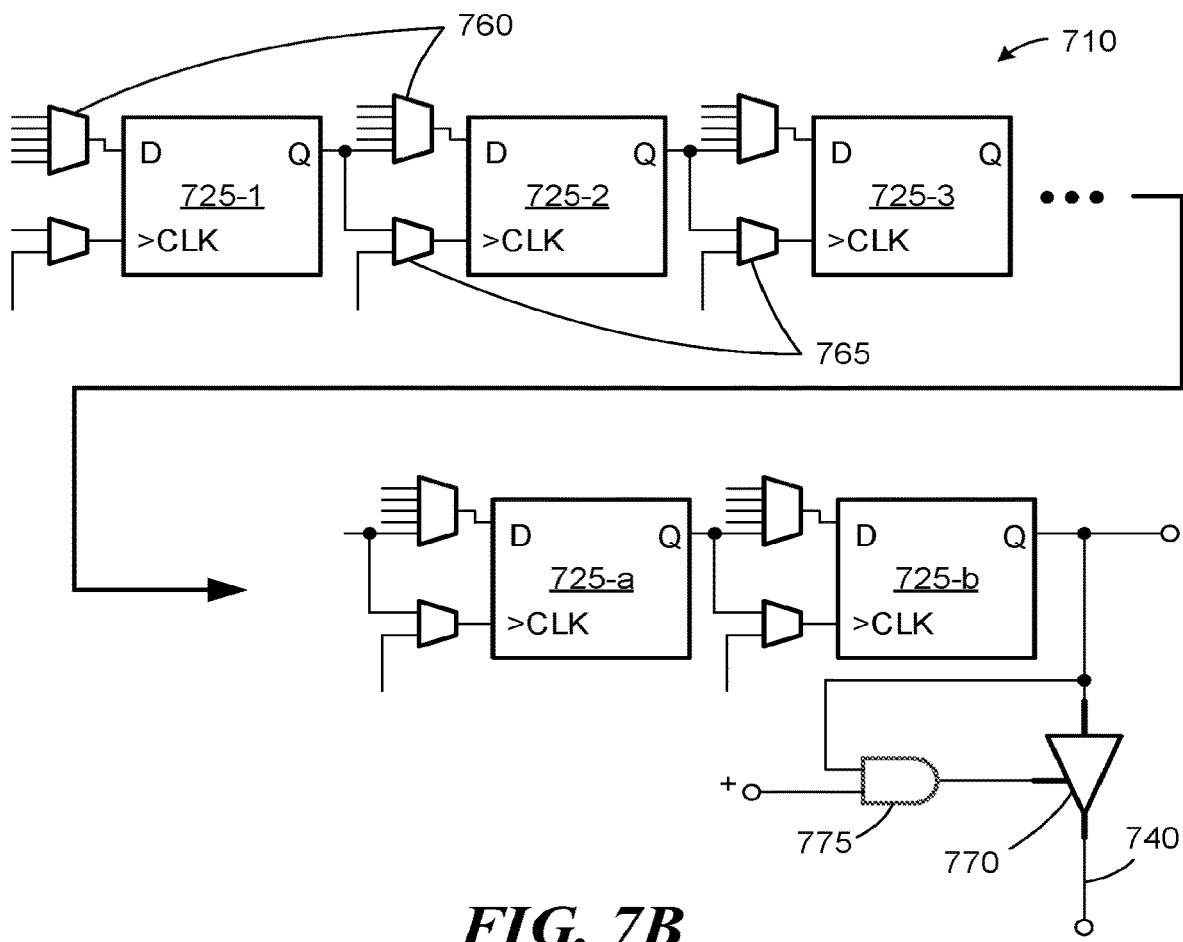
FIG. 7B illustrates further details of an embodiment of circuitry for infinite-dynamic-range sensing in a pixel of the present technology.

In some embodiments of the present technology, output terminals for outputting values from the counters may be connected in parallel across corresponding counters in an array (e.g., the array 406), as described above in connection with FIG. 5A and/or FIG. 5B. In some cases, bit values for the counters may be connected in parallel across corresponding counters in the array. For example, the data-shift lines may comprise parallel data lines 730, 740, with a total number of the parallel data lines 730, 740 equaling the number of bits of the counter 710. Multiplexers may be used for each of the parallel data lines 730, 740. For example, a MSB from each counter in a row or column of pixels ICs of the array may be connected to a same data-shift line. In some cases, values of MSBs may be read from shared data-shift lines using a synchronous cadence read-out, for example. In some cases, a counter may be configured to pass bit-values between each counter unit that is used to record a bit, as depicted in FIG. 7B for example, as described in U.S. Pat. No. 9,768,785; in such cases, bit-values for counters may not be connected in parallel across corresponding counters in the array 406. Instead, bit values may be shifted sequentially onto a same data-shift line. (FIG. 7B is discussed in detail below.)

In operation and according to some embodiments of the present technology, the infinite dynamic range counter 710 may operate as follows. While counters accumulate count values during an exposure period, the values (logic levels) of the counters' MSBs (or groups of MSBs) may be read and monitored by the read/store logic 730 over the MSB data lines 740. In some implementations, when a counter's MSB toggles to a logic 1 state (or group of MSBs toggle to a predetermined value), the value may be signaled to and/or detected by the read/store logic 730 by placing the value on one or more data line(s) (e.g., placing a MSB's value on the data line 740). In some cases, a bit's value may be placed on a data line 740 by in-pixel logic, such as an AND gate, for example. In some cases, all MSB bit values (or groups of MSBs values) for all counters in the array (e.g., the array 406) may then be destructively read out so that values of the MSBs that have toggled to 1 (or a predetermined value) are read and reset to 0. A toggling of the MSB (or group of MSBs) may indicate a roll-over of the b−1 bit (or b−N−1 bits) and an upcoming roll-over for the b-bit counter. A record of a counter's toggling or roll-over, and the counter's address, may be stored in the memory 750 by the read/store logic 730. The read/store logic 730 may reset the counter's MSB-value(s) over control lines (e.g., the control line 742). The counters may then be allowed to continue accumulating count values until a next MSB (or group of MSBs) toggles. The number of togglings or roll-overs for each counter may be accumulated in the memory 750, where each toggling may represent a count of $2^{(b-1)}$ (or $2^{(b-N-1)}$)). For count down operation, roll-over events may be detected by detecting a logic 0 level, or by inverting the MSB output and detecting a logic 1 level.

In some embodiments of the present technology, in-pixel logic or edge logic may be configured to detect, for example, a falling edge or negative edge of the b, bit. For example, a monitor flip-flop may be configured to latch a logic 1 value to its output when the MSB-value rolls over from 1 to 0. Additional in-pixel logic may assert output of the monitor flip-flop on a data line that can be detected and read. The monitor flip-flop may then be reset to detect a next falling edge of the MSB. In such embodiments, each detected logic 1 value from the monitor flip-flop may indicate $2^b$ counts and the MSB may not need to be reset.

In some embodiments of the present technology, instead of reading all the counters of the array after detecting a logic 1 on the data line 740 of one of the MSBs, only MSB-values of counters (or monitor flip-flop outputs) in a row and/or a column containing the counter that has toggled may be destructively read. Such a strategy may reduce read-out times and avoid reading of counters that have not yet had an MSB toggle. In other embodiments, time-gated row and column monitoring may be performed by the read/store logic 730 to detect and determine a location in the array of a counter whose MSB-value has toggled, and only that counter (or that monitor flip-flop) may be destructively read.

In alternative embodiments of the present technology, read-out times of counters' MSB-values may be predicted based on prior count accumulations. For example, a first exposure over a first time period may be performed for a short duration in which none of the counters' MSB-values roll over. First count values may accumulate on the counters during this exposure period. In some cases, times for reading and resetting MSB-values from one or more counters may be determined from the $(b-1)^{th}$ bit value (or other bit's value) of a relevant counter in the array. For example, when the $(b-1)^{th}$ bit value (or other bit value) of a first counter in the array toggles to a logic 1 level and the duration of the exposure period is known, a count rate for the counter can be determined. The count rate can be used to predict, on a subsequent longer exposure, when the counter's MSB value will toggle to a logic 1 level, e.g., and must be read (e.g., accumulate a roll-over count in memory 750) and/or reset. Accordingly, the count rates for all counters in an array (e.g., the array 406) may be determined and used to predict when one or more counter(s) in the array will roll over. The information can then be used to determine, for longer exposures of a same scene, when to read the MSBs of the counters, either globally (e.g., reading all counters' MSBs sequentially in a read-out) or individually.

In some embodiments of the technology described herein, the duration of the first exposure may be estimated based on prior images, or several exposure periods may be tried and linearity of increasing counts between at least two successive exposures checked to determine whether any of the counters have rolled over. If all counters have increased linearly or nearly-linearly in two successive exposures, then results of any of the successive exposures may be used to estimate when roll-overs could occur.

In some implementations, a first exposure's duration may be determined and terminated automatically. For example, a counter's MSB value may be asserted on a row or column data-shift line as soon as the MSB toggles to a logic 1 level. The value may be asserted by in-pixel logic. Edge logic may detect the logic level and terminate the exposure period. The read/store logic 730 may then read out all counters and process their count values to determine count-accumulation rates for each counter. The count-accumulation rates may then be used to determine when to read MSB values from one or more counter(s) during a subsequent longer exposure period of a scene during which at least some counters' values would roll over.

In yet further embodiments of an infinite-dynamic-range counter of the present technology, each such counter may be divided equally or unequally into two bit groupings and each grouping may be used to accumulate counts. In such embodiments, the bit groupings may be read at different times and total counts accumulated in memory located outside an array (e.g., the array 406) of pixels. For example, a first of the two bit groupings (e.g., bit 1 to bit (b–N–1)) may be read and reset at a first time, and subsequently the second of the bit groupings (bit b–N to bit b) may be read and reset a second time, and the process may be repeated multiple times during an exposure period for an image. In some cases, the reading and resetting may alternate between the two bit groups for each successive read. In other cases, the read and reset rates may differ for the two groups. The read and reset rate for a bit group may be determined by any of the above-described methods for an infinite-dynamic-range counter.

For CPIs that employ infinite-dynamic-range counting, additional operations may be executed on count accumulations that have been recorded in the memory 750. For example, when on-chip data processing or data-shift operations occur (such as for filtering), then such operations can be mirrored or complied with using the count accumulation data in the memory 750. In an implementation, if counter values are shifted in the CPI's array (e.g., the array 406), then addresses associated with off-array count accumulations may be updated to reflect the on-array shift of counter data.

Further details of example circuitry for a counter configured for infinite dynamic range operation are illustrated in FIG. 7B. In some implementations, the b-bit counter 710 may be configured as series-connected D or JK flip-flops 725-1, 725-2, . . . 725-a, 725-b with reconfigurable data inputs D and reconfigurable clock inputs CLK. Each of the flip-flops 725-1, 725-2, . . . 725-a, 725-b may be used to store one bit. For count accumulation corresponding to a received signal, the flip-flop clock inputs may be reconfigured on-the-fly, so that the series of flip-flops 725-1, 725-2, . . . 725-a, 725-b may operate as a ripple counter. For example, referring to FIG. 3, the pulses 325 from the current-to-frequency converter 310 may be applied to the clock input of the first flip-flop 725-1 (corresponding to the LSB) and used to toggle the output of that flip-flop. An output value Q of each flip-flop may then drive the clock of the next flip-flop to form a ripple counter. For read-out, the clocks of each flip-flop may be connected to a same read-out clock and the data inputs D connected to the data outputs Q of the preceding flip-flop in a chain, so that data may be shifted across and out of the counter 710.

For at least some of the above embodiments of describing a counter configuration, a tri-state buffer 770 may be used to place the output value Q of the flip-flop 725-b, corresponding to the MSB, on the data line 740, as illustrated in FIG. 7B. In some cases, additional tri-state buffers may be used for other flip-flops. For configurations where a counter is adapted for infinite-dynamic-range counting and where toggling of the counter's MSB to a logic 1 level may be automatically sensed, an AND gate 775 (or analogous logic circuitry) may be used to monitor the output value Q of the MSB flip-flop 725-b and to activate the tri-state buffer 770 when the MSB toggles to a logic 1 level. An advantage of using the tri-state buffer 770 is that a flip-flop's output value Q may be isolated from the data line 740 when the output value Q is at a logic 0 level. In some implementations, the data line 740 may be a separate and dedicated data line for monitoring only the value of the MSB (e.g., separate from a data line that is used to read out the entire counter value or to provide orthogonal shifting of counter values in the array 406). In other implementations, the data line 740 may be a same data line that is used to read out the entire counter value or to provide orthogonal shifting of counter values.

Counters configured for infinite-dynamic-range counting may be included in CPIs having multiple counters in each pixel, as described above (e.g., for multi-thread signal processing). Counters configured for infinite-dynamic-range counting may also be included in CPIs configured for down-sampling of modulated signals, as described below in connection with FIG. 9.

Figure 8:
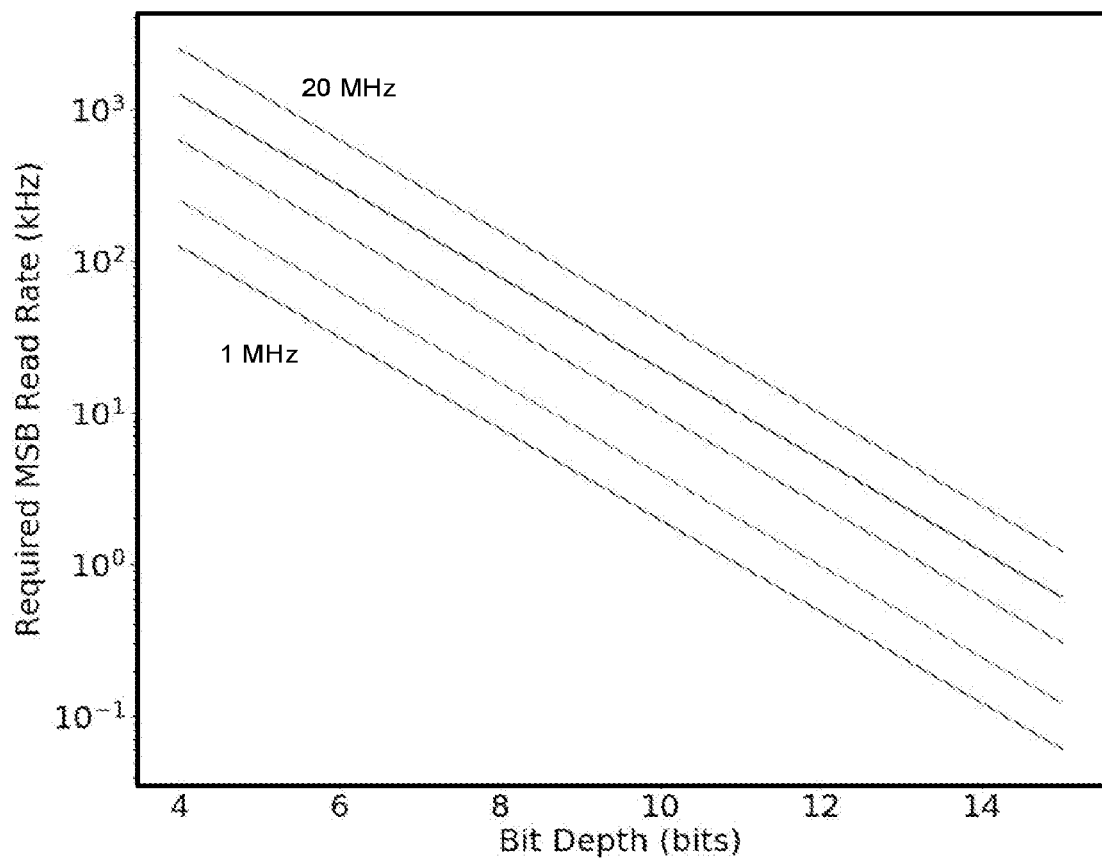
FIG. 8 plots examples of most significant bit read rates for counters adapted for infinite-dynamic-range sensing in a pixel, according to some embodiments of the present technology.

Example read-out rates for MSB values are plotted in FIG. 8 for various count accumulations rates from 1 MHz to 20 MHz and counter bit depths. The plotted MSB read-out rates correspond to rates required to avoid missing a roll-over event. The lines of count accumulations rates are, from top to bottom, 20 MHz, 10 MHz, 5 MHz, 2 MHz, and 1 MHz.

By monitoring, reading out MSB values of counters, and recording roll-over events in the memory 750, long exposure durations may be performed and/or scenes with high-intensity sources may be viewed and captured with high dynamic range. Counters may roll over multiple times during a high-dynamic range exposure period, and the number of roll-over events for a counter may be accumulated in the memory 750. The number of roll-over events stored in the memory 750 are in quanta of $2^{(b-1)}$ counts. At the end of a high-dynamic range exposure period, the number of counts for a counter indicated in the memory 750 are combined with the final count value for the counter, to obtain the total number of counts. By using the above approach for predicted read rates, the inventors have shown in simulations that total counts in excess of $10^6$ can be accurately recorded for an 8-bit counter used in a pixel. The count accumulation rate was 10 MHz and the MSB read-out rate was 80 kHz. In this way, the dynamic range of a sensor can be increased to essentially any value, which is limited by the exposure duration or size of the memory 750. The memory 750 may be off-chip in some cases or on-chip in circuitry located around an edge of the CPI's array of pixels (e.g., the array 406).

Additional aspects are possible with CPIs described above (e.g., the CPI 100, 102, 401). For example, the pixel ICs 120 (which may include multiple counters, as described above, and/or circuitry for infinite-dynamic-range counters) may be configured for digital pixel down-sampling, in some implementations. For some applications, it may be desirable to detect the frequency or measure the phase of an intensity-modulated light source that is present in a scene or used to illuminate one or more object(s) in a scene or environment viewed by a CPI. For example, the phase of amplitude-modulated light returned (e.g., scattered or reflected) from an object may contain information regarding the distance of the object from an observer (e.g., the CPI). In-pixel digitization with two counters may be used to determine phase of amplitude-modulated light. For example, the two counters may be controlled to cyclically count up and down at a same frequency as the modulated source, but one counter's phase may be shifted by 90° with respect to the other counter (e.g., in-phase and quadrature detection). A drawback to using amplitude-modulated light to measure distance is that relatively high modulation frequencies (e.g., MHz to GHz frequencies) may be needed to achieve high resolution of the distance. The use of high modulation frequencies may challenge the ability of current-generation, up/down counting, digital-pixel electronics. In addition, power requirements for detecting high-frequency modulations can be unacceptably high for some embodiments. The inventors have recognized and appreciated that apparatuses and methods may be employed to adapt sensors of CPIs to down-sample the modulated signals so that relatively low frequency up/down counters may be used to detect phases of modulated signals at much higher frequencies.

Figure 9:
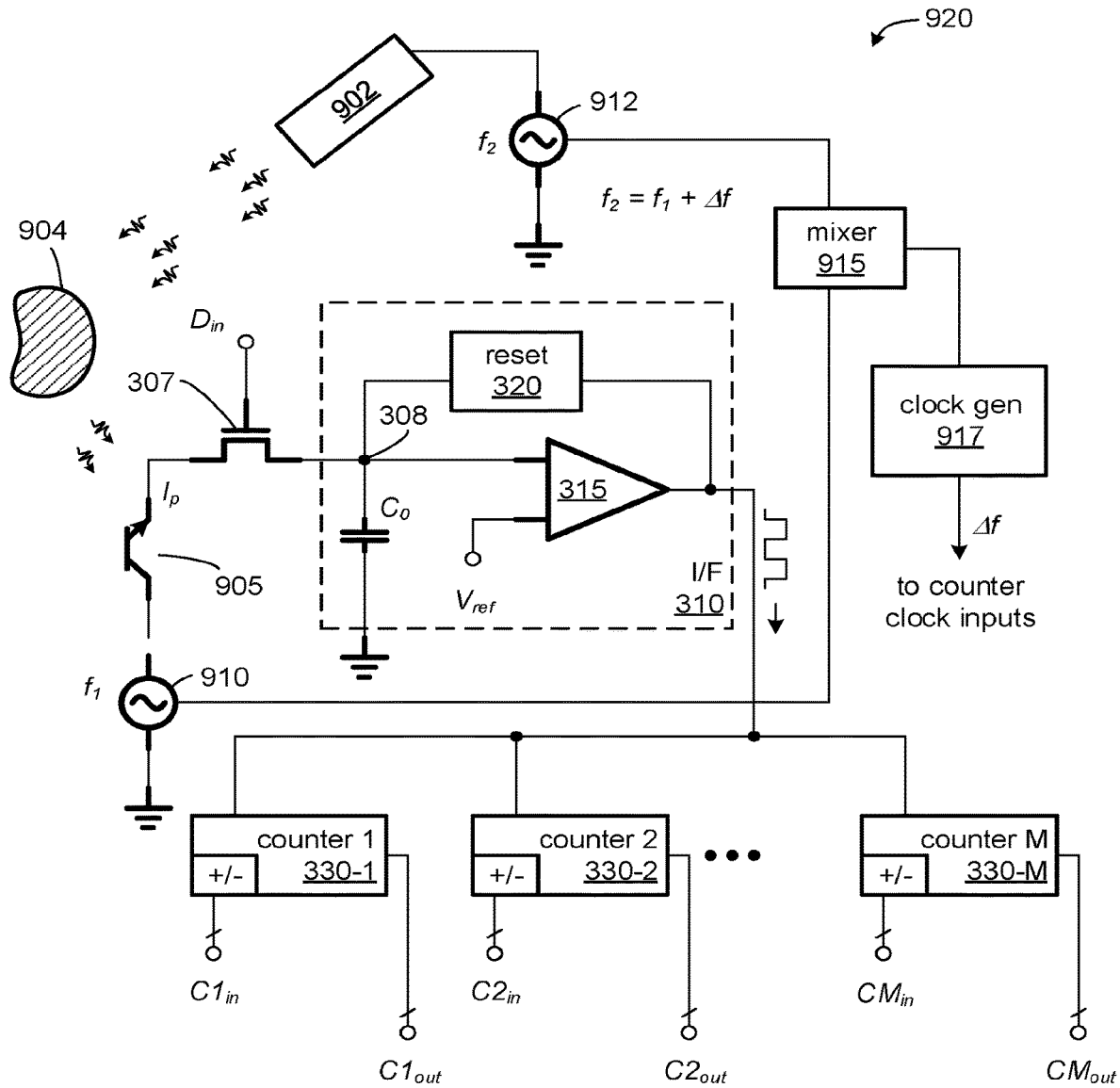
FIG. 9 depicts an example of circuitry for a pixel integrated circuit that is adapted for digital down-sampling, according to some embodiments of the present technology.

FIG. 9 illustrates an example of a pixel IC 920 adapted for digital down-sampling. The pixel IC 920 may be used in pixels of a CPI and may contain at least some of the same components as the pixel IC 120 described above in connection with FIG. 3; such common components will not be described again and have been given the same reference numerals. In some embodiments of the present technology, a detector 905 of a CPI may be adapted to be biased with a modulated supply 910 that can provide, for example, a modulated bias or supply voltage to the detector 905. The modulated supply 910 may be located off-chip and provided to one or more pixels' detectors via bias lines. The detector 905 may be a p-n junction photodiode in some embodiments or may be a phototransistor, as illustrated in FIG. 9.

For digital down-sampling, the modulation of the supply 910 may be at a first frequency $f_1$ that differs from a second modulation frequency $f_2$ that is used to modulate the amplitude of a light source 902 that illuminates an object 904, where $f_2=f_1+\Delta f$. The object 904 may be in a field of view that is imaged onto an array of detectors 905 in a CPI. In some implementations, the light source 902 may comprise a laser, one or more laser diodes, one or more light-emitting diodes, etc., which may be driven by a second modulated supply 912. Modulated light may be returned (scattered or reflected) from the object 904 and detected by the modulated detector 905.

According to some implementations of the present technology, one or both of the modulated supplies 910, 912 may be included with either or both of an array of pixel ICs (e.g., the pixel ICs 120) or an array of detectors (e.g., the detectors 110). In some implementations, one or both of the modulated supplies 910, 912 may be included in a CPI system. In some cases, a CPI system may be provided without the supplies 910, 920, but may have modulation inputs configured to receive one or both of the modulation signals from modulated supplies 910, 920.

In some embodiments, one of the frequencies $f_1$ or $f_2$ may be derived from the other (e.g., by using a mixer that mixes a signal having the frequency $f_1$ with a signal from a source operating at the difference frequency $\Delta f$). In such embodiments, a CPI may include one or both of a difference-frequency source and a high-frequency source. Further, an output from the difference-frequency source may be used to drive count-up and count-down cycles of one or more counters instead of an output from a mixer.

The difference frequency $\Delta f$, corresponding to the difference between the two modulation frequencies $f_1$, $f_2$, may be significantly smaller than the value of either frequency. For example, the difference may be tens or hundreds of kilohertz (e.g., between 10 kHz and 500 kHz) whereas the modulation frequencies may be in the megahertz to multi-gigahertz range. Modulation of the bias on the detector 905 may change the sensitivity of the detector 905 and/or effectively gate the detector 905 on and off. The detector 905 may then act as a mixer and demodulate the received modulated optical signal so that the counters 330-1, 330-2, ... 330-M may detect at the difference frequency if. Using this technique, no loss of information from the modulated light source 902 will occur, and high-resolution distance determination and depth imagery may be achieved with low-frequency counters in pixel ICs. For example, digital up-down counting during an exposure period may be performed at the difference frequency for in-phase/quadrature phase determination, as described above. In some cases, the first and second frequencies $f_1$, $f_2$ may be provided to a mixer 915 (which may be included with a CPI system). An output from the mixer 915 may be used to generate a clock signal with clock generation circuitry 917. The generated clock signal may determine the periodicity of count-up and count-down cycles of one or more of the counters 330-1, 330-2, . . . 330-M. A benefit to this technique is that pixel and device power may remain low while still measuring the return phase of a signal reflected or scattered from the object 904.

In some implementations, an optical element (lens, diffractive optical element, etc.) can be placed in front of the modulated light source 902 to project a pattern of light onto the object 904. The pattern may be, for example, an array of spots or lines. Distortion of the pattern and/or distances to each portion of the pattern may be detected with a CPI, even though patterned light returned from the object 904 may be dim or not visible to the naked eye due to other illumination in the field of view of the object. Analysis of the pattern distortion may be used to determine three-dimensional geometry of the object as well as one or more distances to the object.

Figure 10:
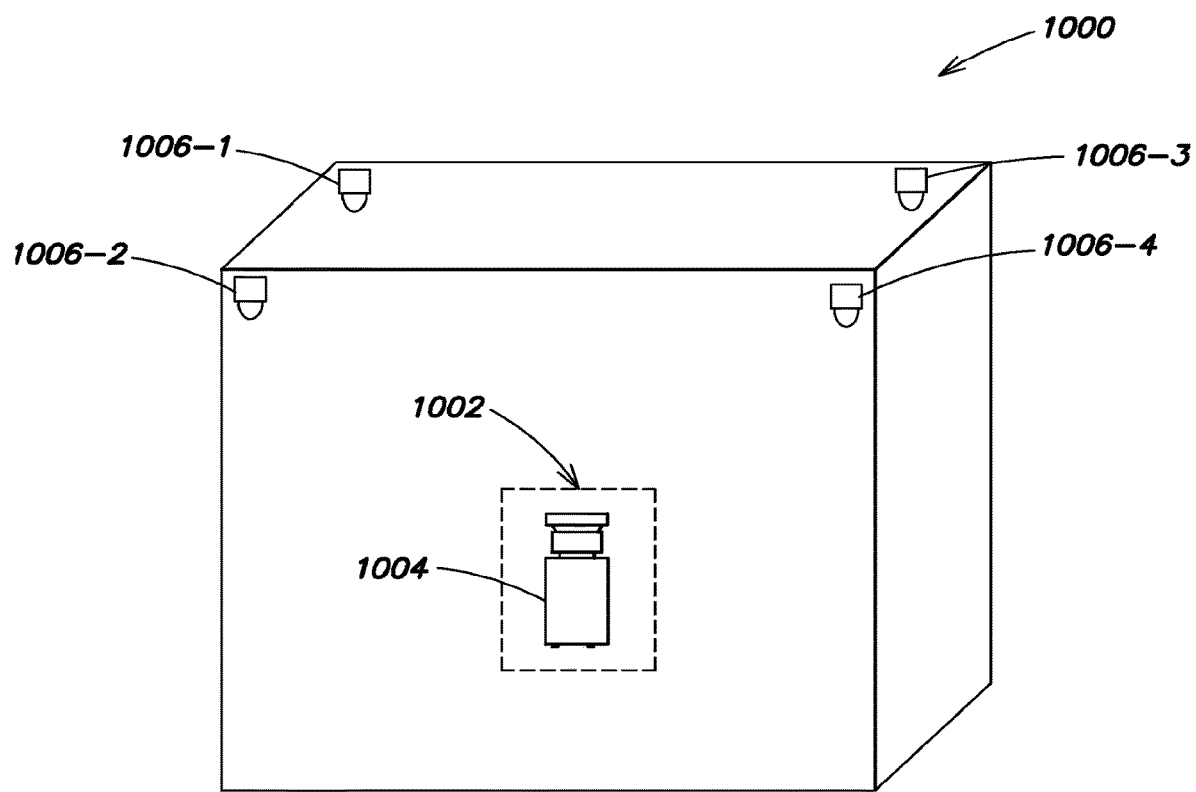
FIG. 10 depicts a system for localizing an object in an environment, according to some embodiments of the present technology.

Aspects of the present technology may be used in a system 1000 that may be used to localize (i.e., to determine the location of) an object 1002 in an environment, as schematically shown in FIG. 10. For example, the object 1002 may be a robot used to patrol a warehouse environment. The object 1002 may be equipped with a camera 1004. In some embodiments, the camera 1004 may be configured similar to the camera 202, and may include a CPI similar to the CPIs 100, 102, 401 described above. The environment may include a plurality of three or more light sources, such as first through fourth light sources 1006-1, 1006-2, 1006-3, 1006-4, each configured to illuminate the environment with modulated light at a different frequency: F1, F2, F3, F4, respectively. That is, none of the frequencies F1, F2, F3, F4 is the same as another one of these frequencies. The light sources 1006-1, 1006-2, 1006-3, 1006-4 may be located at predetermined known locations in the environment, and may be point sources (e.g., photodiodes, laser diodes, etc.).

Using the distance determination techniques described above, the distance of the camera 1004 to each of the first through fourth modulated light sources 1006-1, 1006-2, 1006-3, 1006-4 may be determined. The CPI of the camera 1004 may include an array of pixels in which a plurality of first counters are modulated at the frequency F1 of the first light source 1006-1, a plurality of second counters are modulated at the frequency F2 of the second light source 1006-2, a plurality of third counters are modulated at the frequency F3 of the third light source 1006-3, and a plurality of fourth counters are modulated at the frequency F4 of the fourth light source 1006-4.

The counters of the camera 1004 may be controlled independently. The first counters may be configured to operate synchronously with the first light source 1006-1, such that they count up and down with the frequency F1. Similarly, the second counters may be configured to operate synchronously with the second light source 1006-2, such that they count up and down with the frequency F2, and so on for the third counters and fourth counters. The first counters may be used to obtain a distance D1 to the first light source, the second counters may be used to obtain a distance D2 to the second light source, the third counters may be used to obtain a distance D3 to the third light source, and the fourth counters may be used to obtain a distance D4 to the fourth light source. As will be appreciated, it may not be possible for the camera 1004 to receive light from all of the light sources 1006-1, 1006-2, 1006-3, 1006-4 simultaneously. However, if distances to three of the light sources (e.g., the second through fourth light sources 1006-2, 1006-3, 1006-4) are known, and using the known locations of these three light sources relative to each other, triangulation techniques known in the art may be used to determine the location of the camera 1004 in the environment.

Although the above example is described for a total of four light sources, it should be understood that for a large environment there may be dozens of light sources, each modulated to a frequency different from another one of the light sources. In this way, although some of the light sources may be obscured from the camera 1004, as long as modulated light from at least three of the light sources may be received and distances to those light sources determined, the location of the camera 1004 in the environment may be determined. As will be appreciated, in implementations where the camera 1004 is attached to a moving object (e.g., a moving robot), the location of the robot may be found by determining the location of the camera 1004.

Figure 11:
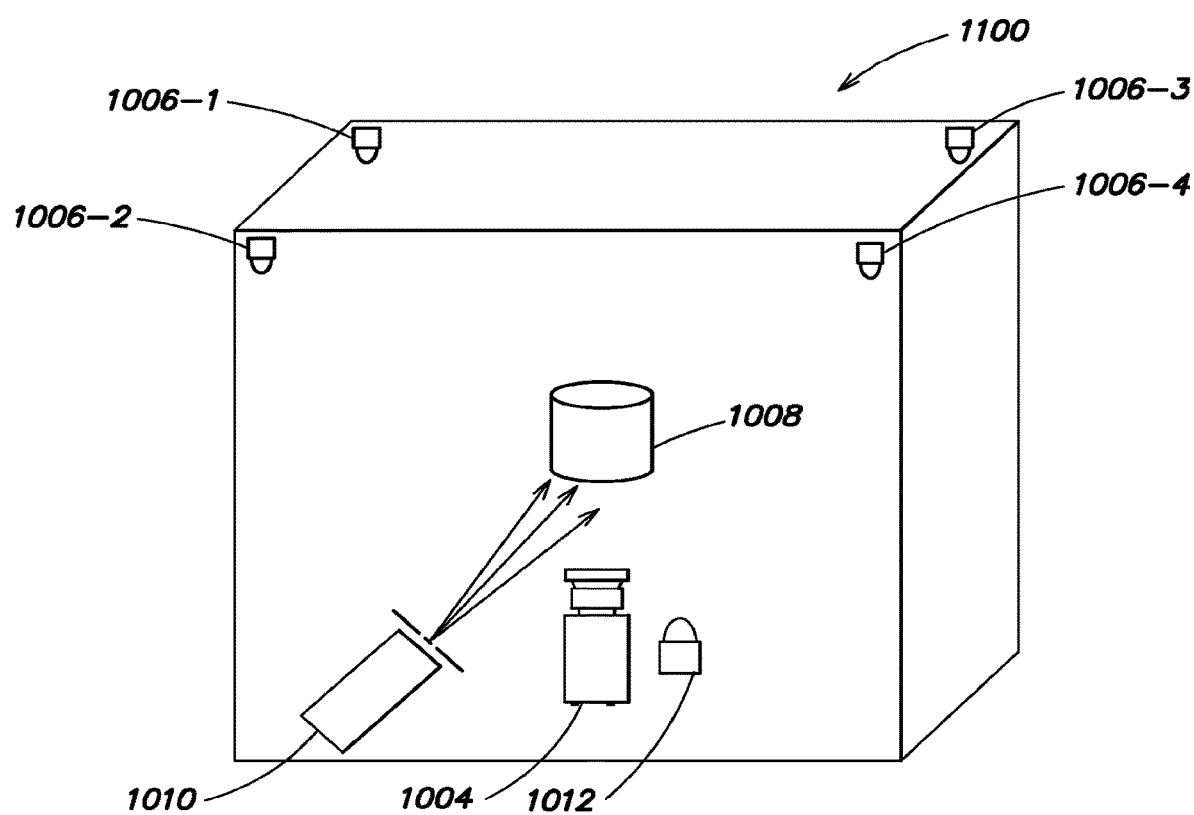
FIG. 11 depicts a system for localizing an object in an environment, according to some embodiments of the present technology.

In some embodiments of the present technology, a system 1100 may be used to localize a moving object 1008 in an environment, as schematically shown in FIG. 11. (The system 1100 is similar in many respects to the system 1000, and therefore may include common components having the same reference numerals.) For example, the object 1008 may be a delivery drone in a warehouse environment. The camera 1004 may be at a fixed location in the environment, and may be localized as described above. The system 1100 may include one or more additional light source(s) position to illuminate the object 1008: a modulated coherent light source 1010 and a modulated high-frequency light source 1012. The coherent light source 1010 may be, for example, a laser diode modulated to a frequency $F_L$. The high-frequency light source 1012 may be, for example, a photodiode that is modulated to a frequency $F_{TR}$ in a range of 60 MHz to 100 MHz (e.g., 80 MHz).

In some embodiments of the present technology, the coherent light source 1010 may be configured to illuminate the object with coherent light having a known pattern (e.g., regularly spaced vertical stripes; horizontal stripes having a known variation in spacing; a grid; an arrangement of spots; etc.). The CPI of the camera 1004 may have counters synchronized to the frequency $F_L$ in order to detect light from the coherent light source 1010 scattered or reflected by the object 1008 and received by photodetectors of the camera 1004. The CPI may process photocurrent from the photodetectors to disregard light signals that do not have the frequency $F_L$. A remaining signal, corresponding to coherent light having the frequency $F_L$, may be processed to determine a three-dimensional shape of the object 1008, based on the known pattern of the coherent light illuminating the object 1008, and distortion characteristics of the scattered or reflected coherent light received from the object 1008.

In some embodiments of the present technology, the high-frequency light source 1012 may be configured to illuminate the object 1008 with light modulated at the frequency $F_{TR}$ of, e.g., 80 MHz, to perform tone ranging or indirect time-of-flight measurements. Using the techniques described above to shift by 90° a first counter's phase relative to a second counter's phase to detect in-phase (I) and quadrature (Q) components of the 80-MHz-light scattered or reflected light from the object 1008, the distance from the camera 1004 to the object 1008 may be determined by an indirect time-of-flight phase determination. The system 1100 may include a controller (not shown) to control light emission from the high-frequency light source 1012. In some embodiments, two high-frequency light sources modulated to have frequencies of f1 and f2 (not shown) may be used, a described above in connection with FIG. 9. The CPI of the camera 1004 may have counters synchronized to the difference frequency Δf corresponding to the difference between f1 and f2. As discussed above, the difference frequency Δf may be significantly smaller than either f1 or f2, enabling high-resolution distance determination to be achieved using low-frequency counters.

Figure 12:
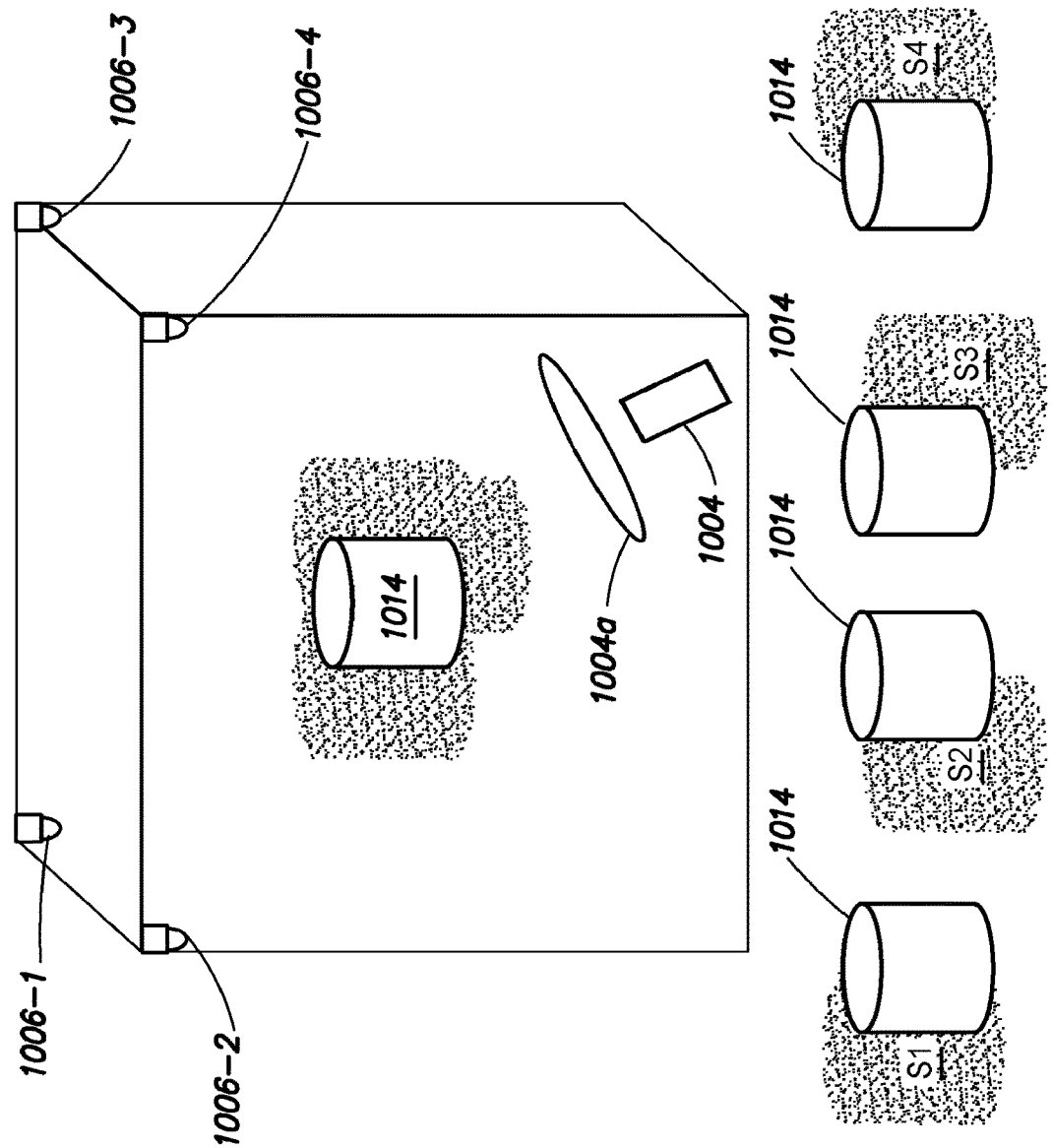
FIG. 12 depicts a system for localizing an object in an environment, according to some embodiments of the present technology.

In some embodiments of the technology described herein, a system 1200 may be used to localize an object 1014 in an environment, as schematically shown in FIG. 12. (The system 1200 is similar in many respects to the system 1000, and therefore may include common components having the same reference numerals.) The camera 1004 may be at a fixed location in the environment, and may be localized as described above. The fixed location of the camera 1004 may be asymmetrical relative to the light sources 1006-1, 1006-2, 1006-3, 1006-4, which are fixed at known locations, as described above. The camera 1004 may include a wide-angle lens 1004a to capture a greater area than is possible without the wide-angle lens 1004a. With such an arrangement, the illumination of the object 1014 by the first light source 1006-1 modulated at the frequency F1 may project a first shadow S1, which may be captured (imaged) by the camera 1004, the illumination of the object 1014 by the second light source 1006-2 modulated at the frequency F2 may project a second shadow S2, which may be captured by the camera 1004, the illumination of the object 1014 by the third light source 1006-3 modulated at the frequency F3 may project a third shadow S3, which may be captured by the camera 1004, and the illumination of the object 1014 by the fourth light source 1006-4 modulated at the frequency F4 may project a fourth shadow S4, which may be captured by the camera 1004. As will be appreciated, the shadows S1, S2, S3, and S4 in FIG. 12 are shown as schematic representations.

The counters of the camera 1004 may be controlled independently. The first counters may be configured to operate synchronously with the first light source 1006-1, such that they count up and down with the frequency F1. Similarly, the second counters may be configured to operate synchronously with the second light source 1006-2, such that they count up and down with the frequency F2, and so on for the third counters and fourth counters. The first counters may be used to obtain image data for the shadow S1, the second counters may be used to obtain image data for the shadow S2, the third counters may be used to obtain image data for the shadow S3, and the fourth counters may be used to obtain image data for the shadow S4. The image data for at least three of the shadows (e.g., S2, S3, and S4) may be used, in conjunction with the known location of the camera 1004 and the known locations of at least three of the light sources 1006-2, 1006-3, 1006-4, to derive distance data and shape data about the object 1014 using the techniques described above.

Aspects of the present technology may be used in a stereo imaging system for obtaining stereographic (three-dimensional) images of an environment. The stereo imaging system may be a passive system, in which light from the environment is captured and processed to generate data for a stereographic image of the environment, or may be a system that has an active mode as well as a passive mode. In the active mode, the system may illuminate the environment, or may illuminate one or more object(s) in the environment, and may process light scattered from the object(s) as a result of the illumination to generate data for a stereographic image of the object(s).

Figure 13A:
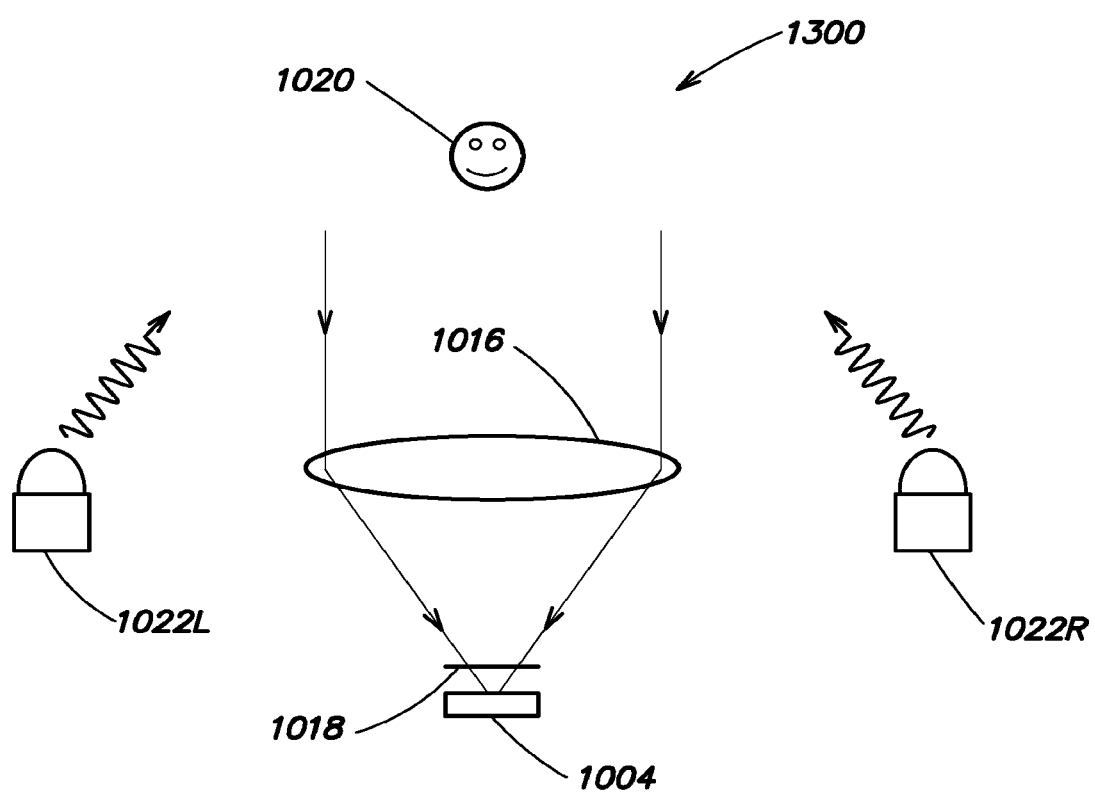
FIG. 13A depicts a system for obtaining a stereographic image of an object in an environment, according to some embodiments of the present technology.

In an aspect of the present technology, a system 1300 may be used to obtain a stereographic image of an object 1020 in an environment, as schematically shown in FIG. 13A. The system 1300 may comprise a camera 1004 that includes an array of photodetectors and a CPI, as described above. A focusing lens 1016 may be used to focus light received from the environment onto the camera 1004. An optical bandpass filter 1018 may be used to block or remove light having an optical property outside of a window or range of acceptable values (e.g., a window or range of acceptable wavelengths) from reaching the camera 1004. The system 1300 may include a first (e.g., left) light source 1022L modulated at a frequency $F_{left}$ and a second (e.g., right) light source 1022R modulated at a frequency $F_{right}$. A controller (not shown) may control the first and second light sources 1022L, 1022R to operate independently of each other, in order to obtain time-multiplexed data. The focusing lens 1016 and the optical bandpass filter 1018 may form part of an optical assembly of the system 1300.

In some embodiments, the first and second light sources 1022L, 1022R may be controlled to operate alternately to illuminate the object 1020 with one light source at a time. For example, light from the first light source 1022L may be illuminated for a duration of $t_L$ then light from the second light source 1022R may be illuminated for a duration of $t_R$, alternating back and forth. The durations $t_L$ and $t_R$ may be the same or may be different from each other, depending on weighting considerations for, e.g., left and right contributions to the stereographic image to be produced. The CPI of the camera 1004 may be controlled by the controller to process data from the duration $t_L$ as "left" image data, and to process data from the duration $t_R$ as "right" image data. The left and right image data may be combined using known stereo algorithms to produce a stereographic image. In some cases, the left image data may be weighted and/or shifted relative to the right image data, in order to obtain a stereographic image having a desired visual effect.

As will be appreciated, the alternating back and forth may be done at high speeds (e.g., $t_L$ and $t_R$ may be 1 μs or shorter), such that the alternating interleaving of the left and right contributions may be used for a real-time or nearly real-time video image showing movement that appears natural and not choppy. As noted above, the interleaving need not be comprised of an even back and forth between the first light source 1022L and the second light source 1022R, where the durations $t_L$ and $t_R$ may be the same or where the left and right contributions are given equal weight; instead, the left and right contributions may be given different weights according to a desired left and right weight distribution and/or according to different values for the durations $t_L$ and $t_R$. Also as will be appreciated, the various types of processing discussed above, such as spatial filtering, temporal filtering, tone ranging, detection using a coherent (laser) source, background subtraction, etc., may be performed using one or both of the first and second light sources 1022L, 1022R.

In some embodiments of the present technology, the first and second light sources 1022L, 1022R may be short wavelength sources that emit light having a wavelength in the infrared (IR) range of wavelengths (e.g., from about 1 μm to about 3 μm), and the photodetectors of the CPI of the camera 1004 may be configured to detect radiation in the IR range of wavelengths. In some embodiments, the first and second light sources 1022L, 1022R may be mid-wavelength sources that emit light having a wavelength in a range of from about 3 µm to about 4 µm and, in some cases, to about 5 µm, and the photodetectors of the CPI of the camera 1004 may be configured to detect radiation in the mid-wavelength range.

In some embodiments of the present technology, the system 1300 may be configured such that the camera 1004 may receive light from the first and second light sources 1022L, 1022R simultaneously. The CPI of the camera 1004 may include a plurality of first counters synchronized with the frequency $F_{left}$ of the first light source 1022L, and a plurality of second counters synchronized to the frequency $F_{right}$ of the second light source 1022R. Stereographic processing of the left and right image data may be performed separately and then combined using known stereo algorithms to form a three-dimensional image.

Figure 13B:
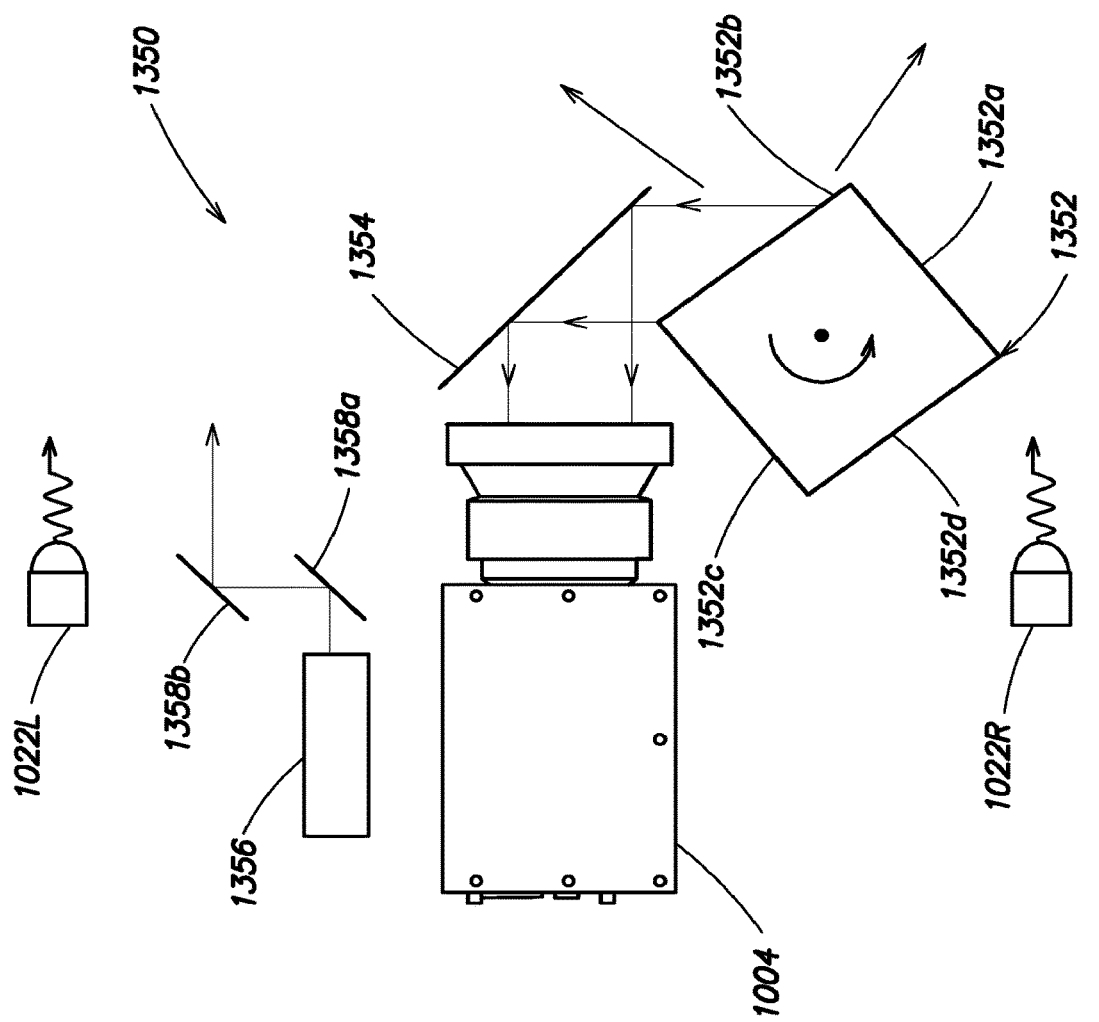
FIG. 13B depicts a system for obtaining a wide-area stereographic image of an object in an environment, according to some embodiments of the present technology.

In some embodiments of the present technology, the system 1300 may be adapted for wide-area motion imaging, as schematically shown in FIG. 13B, which depicts a wide-area imaging system 1350. The system 1350 may be a variant of the system 1300, and therefore common features may have the same reference numerals and may not be described again. The camera 1004 may receive light from the environment indirectly, via an optical scanner 1352 and a mirror 1354. A controller (not shown) may be connected (wirelessly or via a wire) to the scanner 1352 to control a rotational position of the optical scanner 1352 and/or to control a rotational speed of the optical scanner 1352. The optical scanner 1352 may include at least one mirror that receives light from the environment and reflects the light to the mirror 1354. The mirror 1354 may be arranged relative to the camera 1004 such that light from the optical scanner 1352 may be reflected by the mirror 1354 onto the photodetectors of the CPI of the camera 1004. As will be appreciated, scanning of the mirror 1354 enlarges a field of view of the camera 1004 to include regions that may not be imaged from light that enters the camera 1004 directly. For example, the camera 1004 may have an angular field of view of about 10° in the absence of the scanner 1352 and the mirror 1354; the scanner 1352 and the mirror 1354 may enable the camera to expand its angular field of view to greater than about 10° (e.g., greater than about 45° or 90° or 120° or 150° or 180° or 250° or more).

In some embodiments of the present technology, the optical scanner 1352 may have four identical mirrors 1352a, 1352b, 1352c, 1352d, such that a single rotation enables an entirety of the field of view to be captured four times. As will be appreciated, other configurations are possible for the optical scanner 1352 (e.g., a single mirror that may be rocked or rotated back and forth though a predetermined range of angles; a two-sided mirror that may be controlled to rotate at a predetermined rate; a polygon of n mirrors that may be controlled to rotate at a predetermined rate; etc.). The optical scanner 1352 and the mirror 1354 may provide the system 1350 with an ability to image peripheral regions and to obtain information on objects that are located in the peripheral regions. Such an ability may be advantageous when the system 1350 is used, for example, on a vehicle, to obtain information on objects that may be near or approaching the vehicle. The system 1350 may include a light source 1356, which may be used to illuminate an object in the field of view of the system 1350 via one or more mirror(s) 1358a, 1358b. In some embodiments, the light source 1356 may be a laser diode that may be controlled in conjunction with the mirrors 1358a, 1358b to detect an object (e.g., a pedestrian), using the counters of the CPI of the camera and the techniques described above, and to issue a warning when the object is within a predetermined distance of the system 1350. In some implementations, the light source 1356 and the mirror(s) 1358a, 1358b may be controlled to operate as a single-element LIDAR device, in which laser light from the light source 1356 is scanned over a portion of the environment by moving the mirror(s) 1348a, 1348b relative to the light source 1356.

In an aspect of the present technology, a system 1400 may be used to obtain a stereographic image of an environment, as schematically shown in FIG. 14A. The system 1400 may comprise a camera 1004 that includes an array of photodetectors and a CPI, as described above. An optical assembly 1024 may be arranged to provide light from the environment to the photodetectors of the camera 1004. The system 1400 may be a passive system that utilizes light from the environment to form an image.

The optical assembly may include first and second primary lenses 1026L, 1026R, first and second reflective modulators 1028L, 1028R, an optical combiner 1030, and a focusing lens 1032. The first primary lens 1026L may be arranged on a left side of the system 1400 and may be configured to direct light from the environment onto the first reflective modulator 1028L. The first reflective modulator 1028L may have a predetermined frequency $F_{modL}$ (e.g., 1 KHz, 500 Hz, etc.), and may be configured to modulate and reflect the light from the first primary lens 1026L to the optical combiner 1030 as modulated first light having the frequency $F_{modL}$. The second primary lens 1026R may be arranged on a right side of the system 1400 and may be configured to direct light from the environment onto the second reflective modulator 1028R. The second reflective modulator 1028R may have a predetermined frequency $F_{modR}$, which may be the same as or different from the predetermined frequency $F_{modL}$ of the first reflective modulator 1028L. The second reflective modulator 1028R may be configured to modulate and reflect the light from the second primary lens 1026R to the optical combiner 1030 as modulated second light having the frequency $F_{modR}$.

A controller (not shown) may be operatively connected to the first and second reflective modulators 1028L, 1028R to control the first and second reflective modulators 1028L, 1028R independent, such that the modulated first light and the modulated second light to arrive at the optical combiner 1030 in an interleaved manner (e.g., an alternating regular pattern of first, second, first, second, etc.). A rate of the interleaving may be set by the predetermined frequencies $F_{modL}$, $F_{modR}$ of the first and second reflective modulators 1028L, 1028R, which may be out of phase with each other.

The optical combiner 1030 may be configured to alternately reflect the modulated first light from first reflective modulator 1028L and the modulated second light from the second reflective modulator 1028R onto the focusing lens 1032, which focuses the light onto the photodetectors of the camera 1004.

The CPI of the camera 1004 may include a plurality of first counters synchronized with the frequency $F_{modL}$ corresponding to the modulated first light, and a plurality of second counters synchronized to the frequency $F_{modR}$ corresponding to the modulated second light. Thus, the modulated first light may be processed by a different thread than the modulated second light. Stereographic processing of the two threads of data may be performed separately and then combined using known stereo algorithms to form a stereo or three-dimensional image. As will be appreciated, in combining the two threads, each thread may be given a different weight than the other thread, in order to, e.g., emphasize (or deemphasize) a particular image characteristic. In addition to (or, optionally, instead of) combining the two threads to form a single image, separate images may be formed from the modulated first light and the modulated second light. With the latter approach, the individual images may yield information regarding objects that appear in the modulated second light at the frequency $F_{modR}$, which may be different from objects that appear in the modulated first light at the frequency $F_{modL}$. In some embodiments, the separate images may be weighted differently.

As will be appreciated, the various types of processing discussed above, such as spatial filtering, temporal filtering, tone ranging, detection using a coherent (laser) source, background subtraction, etc., may be performed using one or both of the modulated first light and the modulated second light.

Figure 14B:
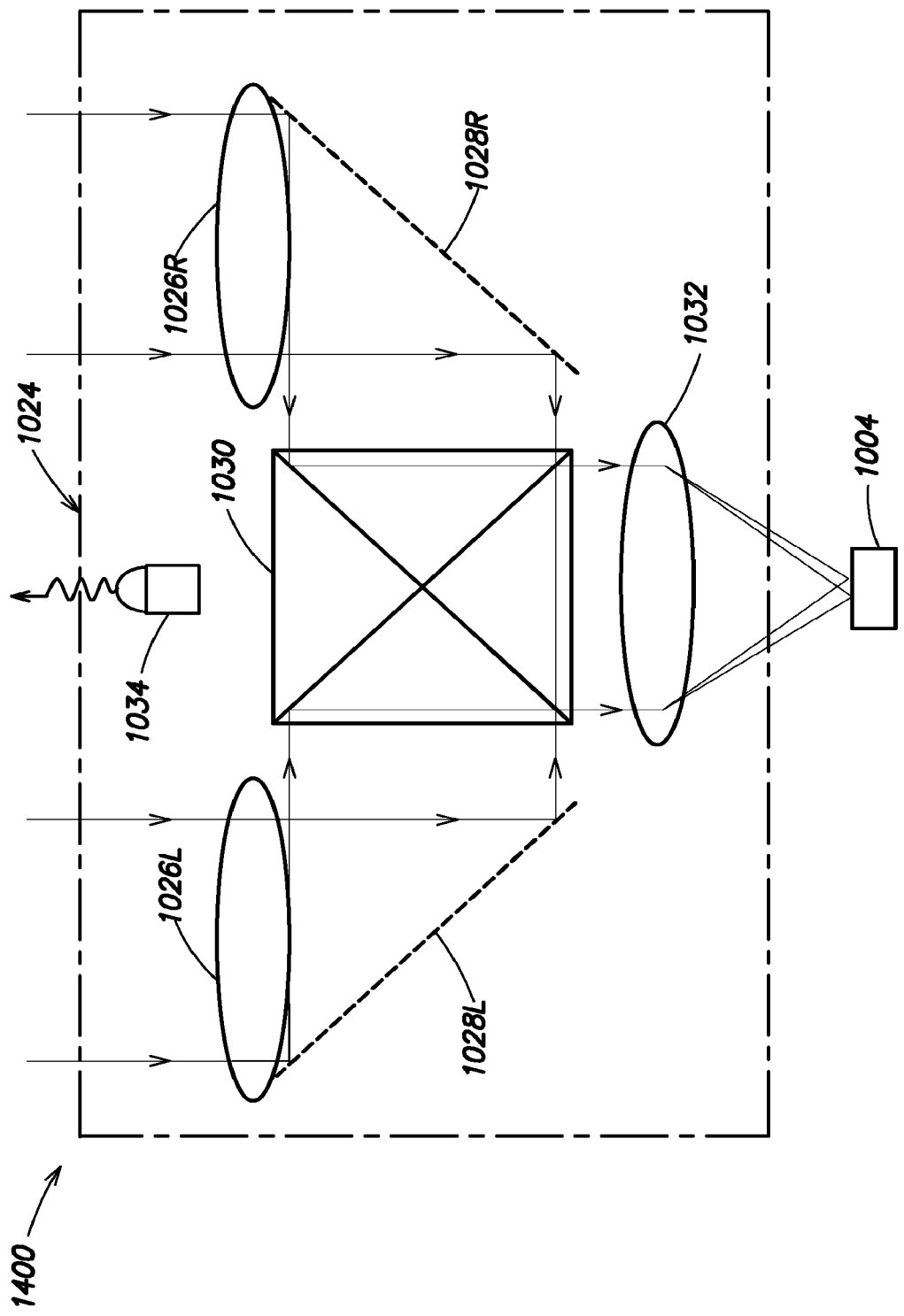
FIG. 14B depicts an active system for obtaining a stereographic image of an object in an environment, according to some embodiments of the present technology.

In some embodiments of the present technology, the system 1400 may be an active system that actively illuminates the environment to form an image, as schematically shown in FIG. 14B. In addition to the components described above, the system 1400 may include one or more light source(s) 1034 arranged to illuminate one or more object(s) in the environment. Similar to the technology described herein, the light source(s) 1034 may be modulated to a predetermined frequency, and counters of the CPI of the camera 1004 may be synchronized to that predetermined frequency. In some implementations, the light source(s) 1034 may emit light having a wavelength in the IR range of wavelengths (e.g., from about 1 µm to about 3 µm), and the photodetectors of the CPI of the camera 1004 may be configured to detect radiation in the IR range. In some implementations, the light source(s) 1034 may emit light having a wavelength in a mid-wavelength range of from about 3 µm to about 4 µm and, in some cases, to about 5 µm, and the photodetectors of the CPI of the camera 1004 may be configured to detect radiation in the mid-wavelength range. It should be understood that although the light source(s) 1034 are show to be centrally located in FIG. 14B, in various embodiments the light source(s) 1034 may be positioned symmetrically or asymmetrically relative to the system 1400.

In some embodiments of the present technology, the system 1400 may include a first optical scanner (not shown) to scan the first light from the environment before the first light reaches the first primary lens 1026L. Such an optical scanner may be similar to the optical scanner of 1352 of FIG. 13B. Similarly, the system 1400 may include a second optical scanner (not shown) to scan the second light from the environment before the second light reaches the second primary lens 1026R. The first and second optical scanners may be configured with steerable optics (e.g., motorized prisms, motorized mirrors, etc.) able to capture light from a larger field of view than possible without scanning. Scanning by the first and second optical scanners may be performed in unison or independently of each other, and may be controlled by a controller (not shown).

In some embodiments of the present technology, the system 1400 depicted in FIG. 14A may include an optical scanner arranged to enlarge a field of view of the system 1400. The optical scanner may be similar to the optical scanner 1352 and may have four similar mirrors, which may be similar to the mirrors 1352a, 1352b, 1352c, 1352d. The optical scanner may be centrally located relative to the first and second primary lenses 1026L, 1026R. Rotation of the optical scanner may enable the first and second primary lenses 1026L, 1026R to receive forward light and peripheral (and/or rearward) light periodically. For example, the optical scanner may be rotated at 10 Hz, with each of the four mirrors corresponding to one quarter of a revolution. Thus, half of the revolution may correspond to light captured from a forward direction, and half of the revolution may correspond to light capture from a peripheral/rearward direction. Photocurrent signals received by the photodetectors of the CPI of the camera 1004 may be processed by the counters of the CPI to form a wide-angle image of the environment.

Figure 15A:
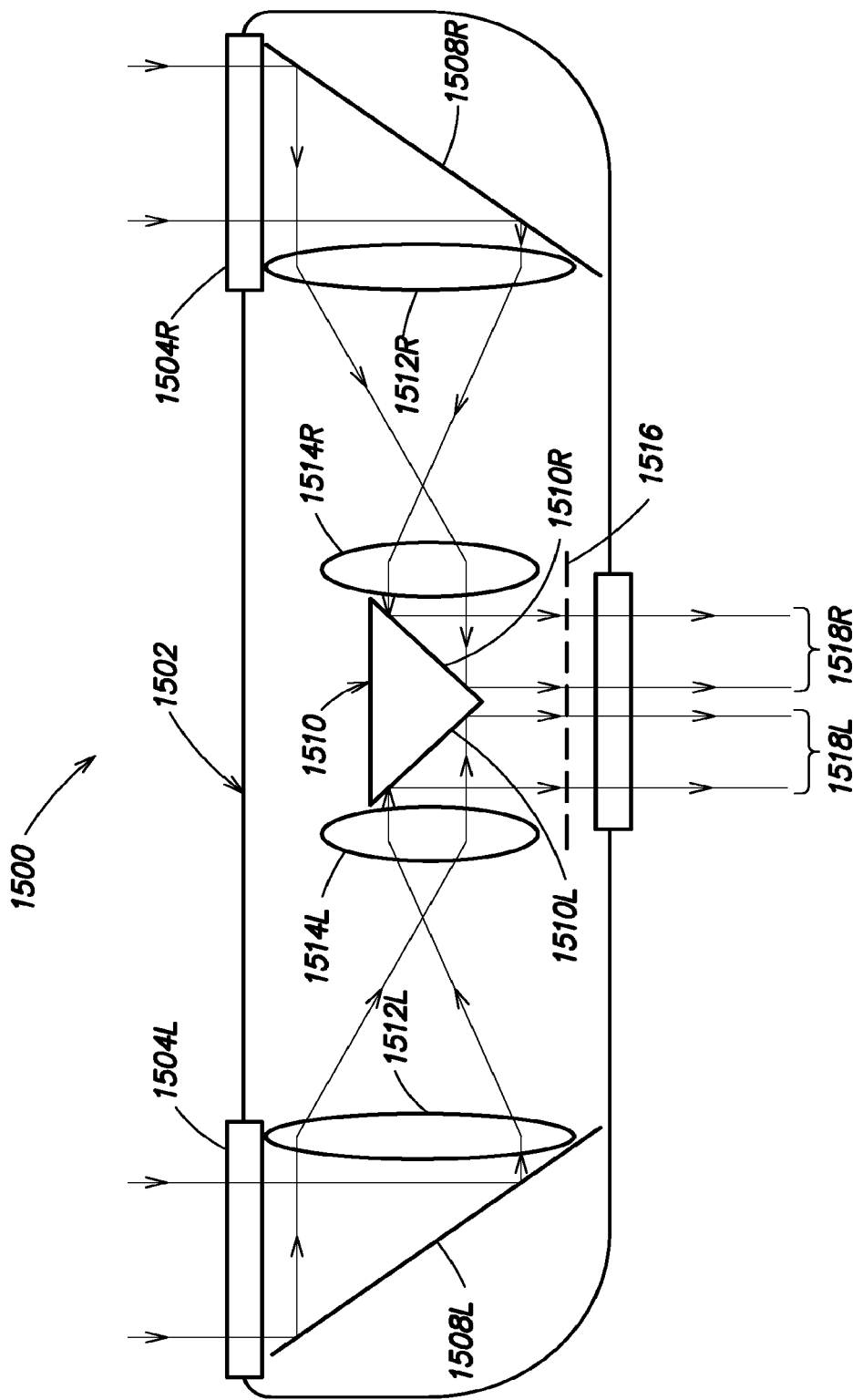
FIG. 15A depicts an optical assembly for an imaging system, according to some embodiments of the present technology.
Figure 15B:
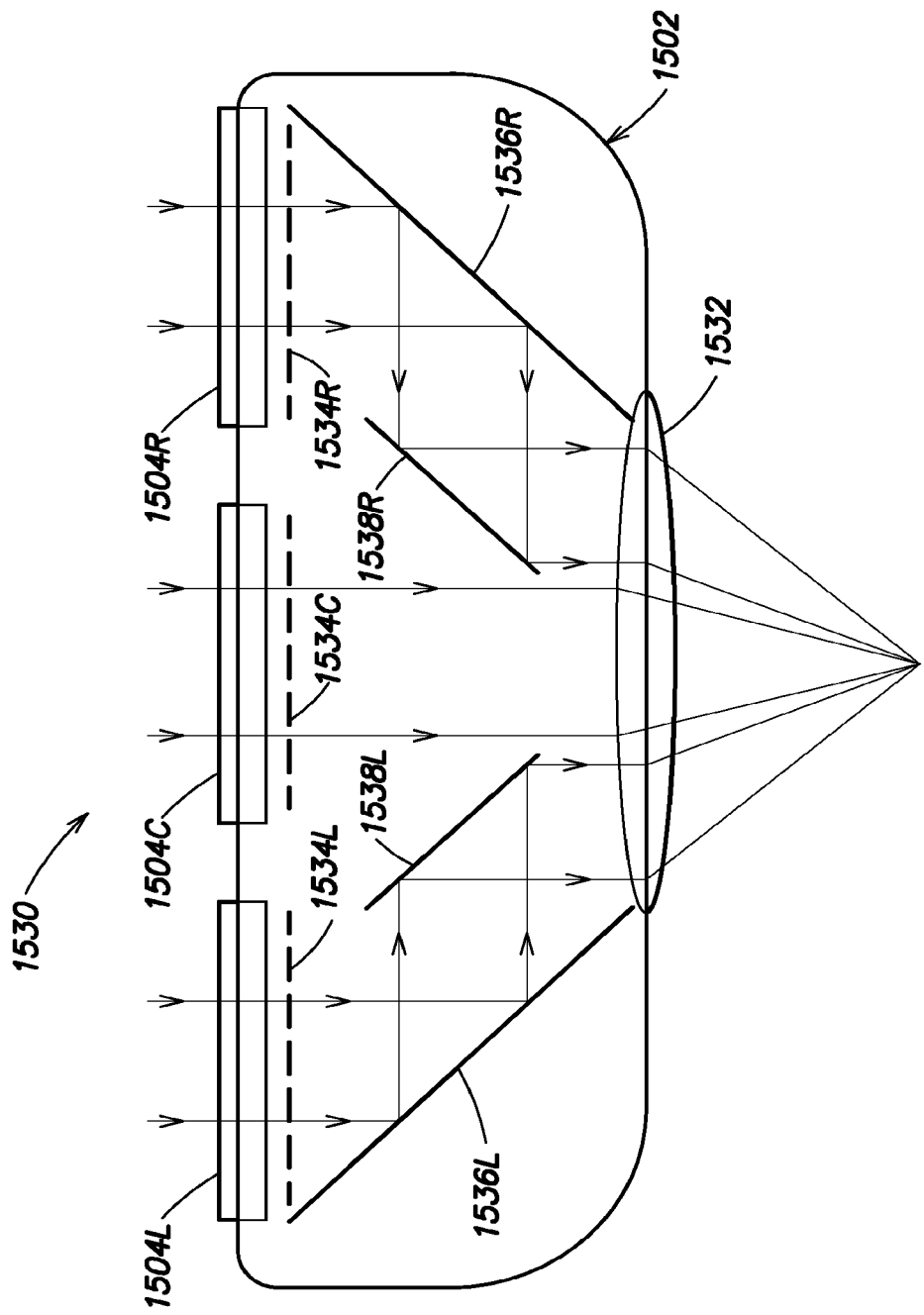
FIG. 15B depicts an optical assembly for an imaging system, according to some embodiments of the present technology.
Figure 15C:
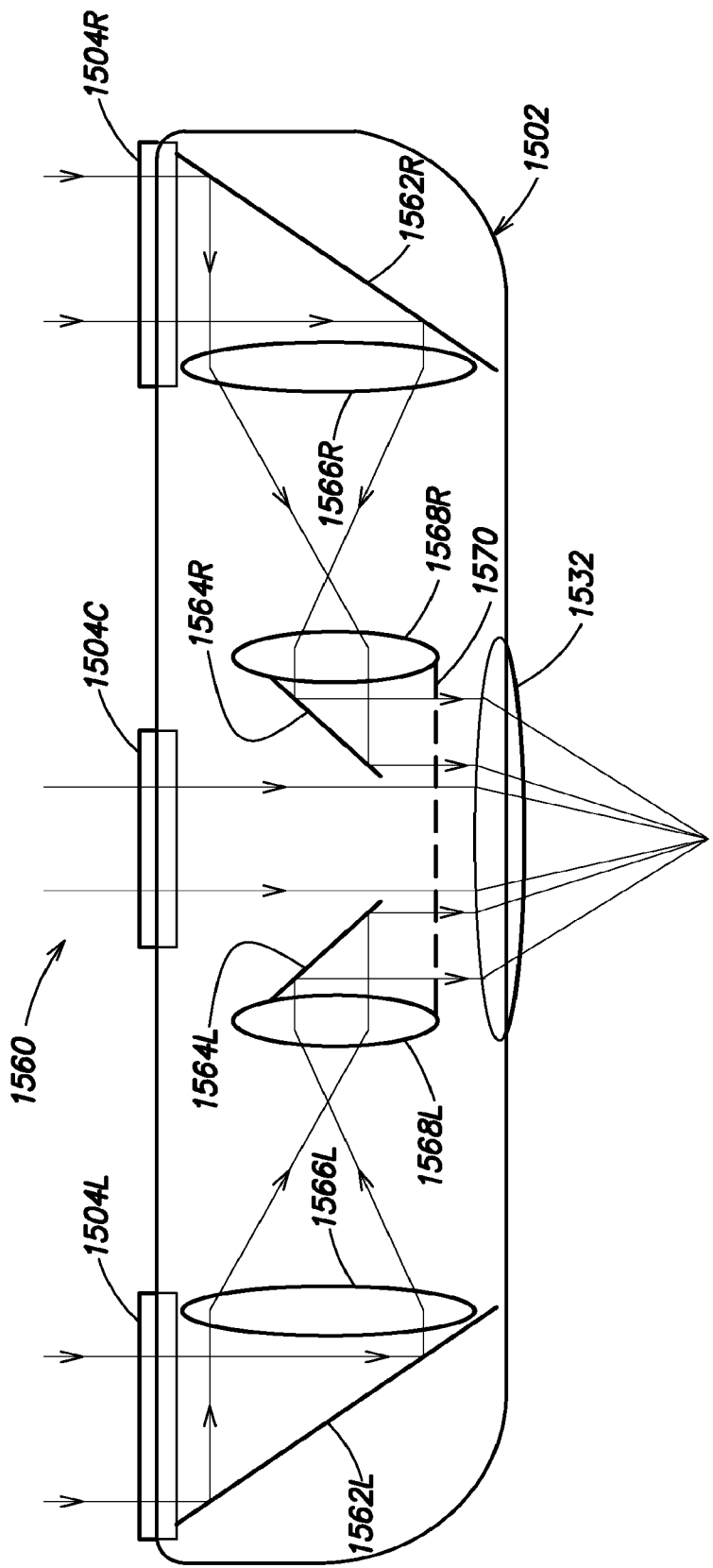
FIG. 15C depicts an optical assembly for an imaging system, according to some embodiments of the present technology.

FIGS. 15A, 15B, and 15C show different embodiments of an optical assembly (e.g., the optical assembly 1024) that may be used with the camera 1004.

According to some embodiments of the technology presented herein, schematically depicted in FIG. 15A, an optical assembly 1500 may include a housing 1502 with first and second input windows 1504L, 1504R and an output window 1506. The first and second input windows 1504L, 1504R may be arranged on an input side of the housing 1502, and may be configured receive light from an environment. The output window 1506 may be arranged on a side of the housing 1502 different from the input side, although in some implementations the output window 1506 and the first and second input windows 1504L, 1504R may be arranged on the same side of the housing 1502. The output window 1506 may be configured to provide light to photodetectors of a camera (not shown). For example, the camera may be the camera 1004, and may include the photodetectors and a CPI, as described above.

The housing 1502 may be configured to house a lens assembly that modulates first light received through the first input window 1504L and second light received through the second input window 1504 R, and to provide modulated light to be outputted via the output window 1506. The lens assembly may include a first mirror 1508L arranged to receive the first light and to reflect the first light onto a multi-sided mirror 1510 via a first focusing lens 1512L and a first collimating lens 1514L. The lens assembly also may include a second mirror 1508R arranged to receive the second light and to reflect the second light onto the multi-sided mirror 1510 via a second focusing lens 1512R and a second collimating lens 1514R. A first side 1510L of the multi-sided mirror 1510 may be configured to direct the first light to an optical field modulator 1516, which modulates the first light to a frequency that is synchronized to counters of the CPI of the camera. Similarly, a second side 1510R of the multi-sided mirror 1510 may be configured to direct the second light to the optical field modulator 1516, which modulates the second light to the frequency that is synchronized to the counters of the CPI of the camera. As schematically depicted in FIG. 15A, modulated first light 1518L and modulated second light 1518R are separate from each other and provided to different portions of the CPI of the camera. With such an arrangement, the modulated first and second lights 1518L, 1518R may be continuously processed by different counters of the CPI to generate data for a stereographic image (or stereographic video).

In an alternative embodiment, the optical field modulator 1516 may comprise a first portion arranged to modulate the first light and a second portion arranged to modulate the second light. The first and second portions of the optical field modulator 1516 may be controlled by a controller (not shown) to operate independently. For example, the first portion may modulate the first light such that the modulate first light 1518L has a first frequency, and the second portion may modulate the second light such that the modulated second light 1518R has a second frequency different from the first frequency. The counters of the CPI of the camera 1004 may include first counters synchronized to the first frequency, and may include second counters synchronized to the second frequency. Thus, the modulated first light 1518L and the modulated second light 1518R may be processed in different threads to provide separate images or a single stereographic image, as described above.

According to some embodiments of the technology presented herein, schematically depicted in FIG. 15B, an optical assembly 1530 may include a housing 1502 with first, second, and third input windows 1504L, 1504C, 1504R and an output lens 1532. The first, second, and third input windows 1504L, 1504C, 1504R may be arranged on an input side of the housing 1502, and may be configured receive light from an environment. The output lens 1532 may be arranged on a side of the housing 1502 different from the input side. The output lens 1532 may be a condenser lens that provides condensed light to photodetectors of a camera (not shown). For example, the camera may be the camera 1004, and may include the photodetectors and a CPI, as described above.

The housing 1502 may be configured to house a lens assembly that includes a first modulator 1534L configured to modulate, at a first frequency, first light received through the first input window 1504L; a second modulator 1534C configured to modulate, at a second frequency, second light received through the second input window 1504C; and a third modulator 1534R configured to modulate, at a third frequency, third light received through the third input window 1504R. First modulated light from the first modulator 1534L may be directed to the output lens 1532 via mirrors 1536L, 1538L. Third modulated light from the third modulator 1534R may be directed to the output lens 1532 via mirrors 1536R, 1538R. Second modulated light from the second modulator 1534C may transmit directly to the output lens 1532, or may be directed to the output lens 1532 via mirrors (not shown). The first, second, and third modulated lights may have different frequencies, such that first counters of the CPI of the camera 1004 may be synchronized to the first frequency of the first modulated light and may process data corresponding to the first modulated light in a first thread, second counters of the CPI of the camera 1004 may be synchronized to the second frequency of the second modulated light and may process data corresponding to the second modulated light in a second thread, and third counters of the CPI of the camera 1004 may be synchronized to the third frequency of the third modulated light and may process data corresponding to the third modulated light in a third thread. The different threads may produce separate images or a single stereographic image, as described above.

As will be appreciated, other arrangements of lens assemblies may be used instead of the lens assembly of FIG. 15B. According to some embodiments of the technology presented herein, schematically depicted in FIG. 15C, an optical assembly 1560 may include a housing 1502 with first, second, and third input windows 1504L, 1504C, 1504R and an output lens 1532. The first, second, and third input windows 1504L, 1504C, 1504R may be arranged on an input side of the housing 1502, and may be configured receive light from an environment. The output lens 1532 may be arranged on a side of the housing 1502 different from the input side. The output lens 1532 may be a condenser lens that provides condensed light to photodetectors of a camera (not shown). For example, the camera may be the camera 1004, and may include the photodetectors and a CPI, as described above.

The housing 1502 may be configured to house a lens assembly that may include a mirror 1562L arranged to receive first light via the first input window 1504L, and to reflect the first light onto a mirror 1564L via a focusing lens 1566L and a collimating lens 1568L. The lens assembly also may include a mirror 1562R arranged to receive the third light via the third input window 1504R, and to reflect the third light onto a mirror 1564R via a focusing lens 1566R and a collimating lens 1568R. The mirrors 1564L, 1564R may be configured to direct the first light and the third light an optical field modulator 1570. The second light may transmit through the second input window 1504C directly to the optical field modulator 1570.

The optical field modulator 1570 may be configured to modulate the first, second, and third lights to a frequency that is synchronized to counters of the CPI of the camera 1004. The output lens 1532 may be configured to focus modulated first, second, and third lights onto photodetectors of the camera 1004, and processed as described above to produce a stereographic image or video.

Figure 16A:
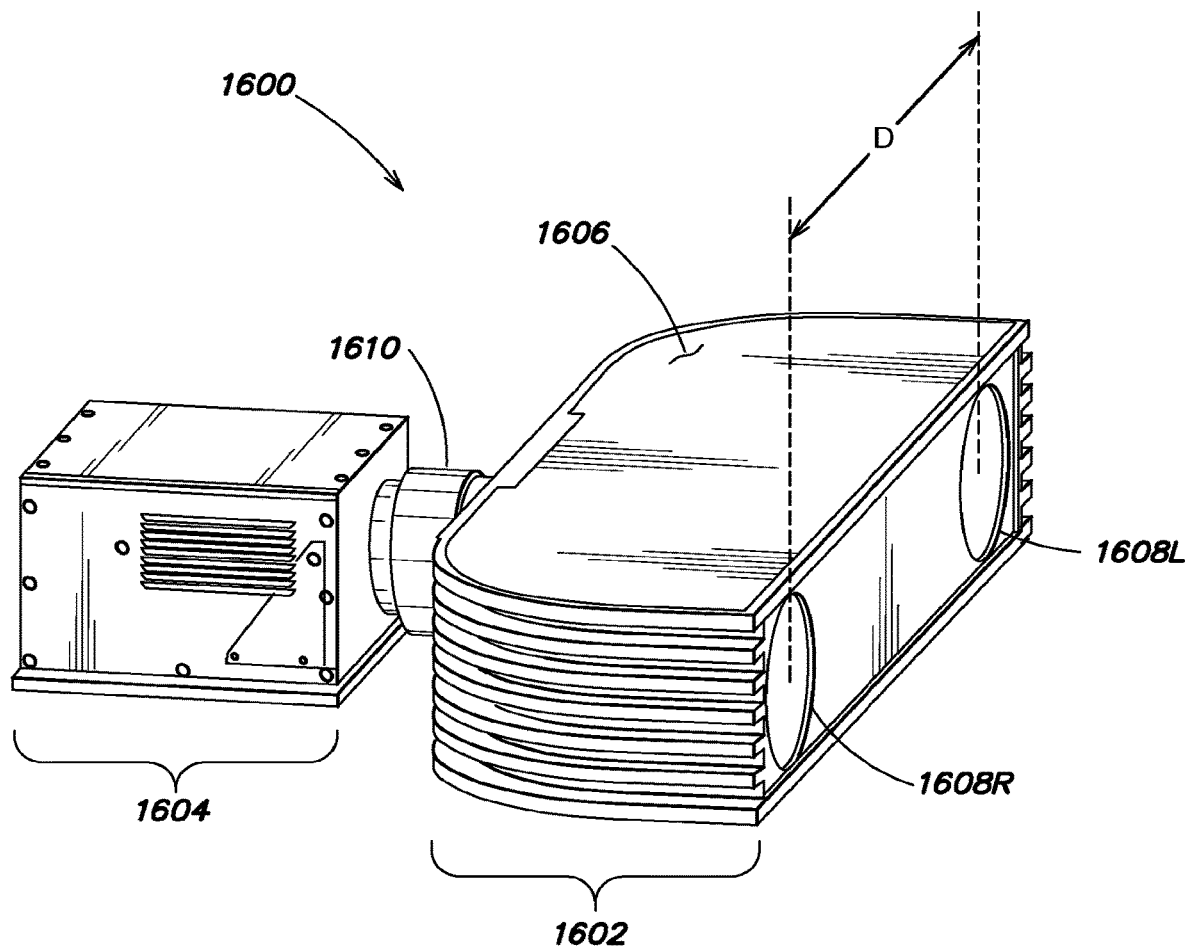
FIG. 16A depicts an stereo imaging system, according to some embodiments of the present technology.

FIG. 16A shows an illustration of stereo imaging system 1600 according to some embodiments of the present technology. The imaging system 1600 may include an optical assembly portion 1602 and a camera portion 1604. In some embodiments, the optical assembly portion may include a housing 1606 having at least two input windows 1608L, 1608R, through which light from an environment of the imaging system 1600 is received. The housing 1606 may contain a lens assembly therein for modulating light received through the windows 1608L, 1608R and providing modulated light to the camera portion 1604. For example, as shown in FIG. 16B, the lens assembly may incorporate the components included in the housing 1502 of FIG. 15A.

The camera portion 1604 may incorporate a CPI (e.g., the CPI 100, 102, 401) comprising an array of pixels that include photodetectors (e.g., the photodetectors 110) and pixel ICs (e.g., the pixel ICs 120). The photodetectors may be configured to receive light from the optical assembly portion 1602. The pixel ICs may be configured to process signals from the photodetectors, as described above, to produce any one or any combination of: a stereographic still image of an environment; a stereographic video of an environment; information on an object in the environment, such as a distance of the object to the camera portion 1604, a shape of the object, a speed of motion of the object, a trajectory of motion of the object, etc.

The input windows 1608L, 1608R may be separated by a center-to-center separation distance D that may be determined based on pixel size and a desired maximum detection distance within which objects may be detected by the imaging system 1600. As described, the array of pixels may comprise an array of photodetectors joined to an array of pixel ICs, with each pixel including a photodetector-pixel IC pair in a stacked arrangement (see FIG. 1B), or the array of pixels may comprise photodetector-pixel IC pairs disposed on a common substrate (see FIG. 1A). The pixel size may be considered a distance from an edge of one pixel to a same edge of an adjacent pixel.

For example, for a desired maximum detection distance of about 200 m, a separation distance D (between the centers of the input windows 1608L, 1608R) of about 4 cm may be used with a pixel size of 5 µm; a separation distance D of about 8 cm may be used with a pixel size of 10 µm; a separation distance D of about 15.5 cm may be used with a pixel size of 20 µm; and a separation distance D greater than 30 cm may be used with a pixel size of 40 µm. A pixel size of 5 µm may enable a maximum detection distance of about 400 m for a separation distance D of about 8 cm. As will be appreciated, the relatively higher costs of producing an array of pixels having a pixel size of 5 µm in comparison with larger pixel sizes may deter use of such a small pixel size for applications in which the imaging system 1600 is used in consumer electronics (e.g., home surveillance/security systems, etc.), but may be economically feasible for applications for which costs are not a concern (e.g., luxury vehicles, commercial establishments, government/military facilities, etc.).

The camera portion 1604 and the optical assembly portion 1602 may be configured to be attached via a connector 1610, which may enable the camera portion 1604 and the optical assembly portion 1602 to be disconnected for maintenance. In some embodiments, the imaging system 1600 may configured to be mounted on a vehicle (e.g., an automobile, a train, a helicopter, an airplane, a boat, a robot etc.), which may be an autonomous vehicle or a manually operated vehicle. In some embodiments, the imaging system 1600 may be configured to mounted on a building structure (e.g., at a factory, a domestic dwelling, an office building, a museum, a control tower of an airport, etc.) As will be appreciated, the imaging system 1600 may be used in applications and locations other than those specifically identified herein.

In some embodiments of the present technology, the imaging system 1600 may be used for active imaging. In these embodiments, the imaging system 1600 may include a modulated light source (e.g., the light source 1034 of FIG. 14B). Object detection, object distance ranging, and other techniques described above may be performed using the modulated light source. For example, light from light source may be modulated at a frequency of in a range of about 500 Hz to about 100 MHz or greater (e.g., 1 kHz, 1 MHz, 10 MHz, 50 MHz, 80 MHz, etc.). In some implementations where light coherency may be desired, the modulated light source may be a laser diode and may have a wavelength in a range of about 0.75 µm to about 3 µm (e.g., 1 µm, 1.5µ, 2 µm, etc.). In these embodiments, the optical assembly portion 1602 may include a lens assembly with some or all of the components schematically shown in FIGS. 14B, 15A, 15B, In some embodiments, the imaging system 1600 may be mounted on a vehicle (e.g., an autonomous car), and may include a modulated light source (e.g., the light source 1034 of FIG. 14B) used to perform detection and/or distance ranging of one or more object(s) within a detection distance of the vehicle, using the techniques described above. The photodetectors of the camera portion 1604 may include photodetectors configured to detect light in a range of wavelengths from about 3 µm to about 5 µm (e.g., a band from 3 µm to 4 µm).

A stereo imaging system according to the technology described herein may be embodied in different configurations. Example configurations include combinations of configurations (1) through (24), as follows:

(1) A stereo imaging system, comprising: a computational pixel imager (CPI) having a plurality of pixels, each of the pixels including: a light sensor, and a plurality of counters configured to receive a photocurrent from the light sensor and to convert the photocurrent to a digital signal; and an optical assembly configured to receive light from a light field and to direct the light to the CPI, the optical assembly including: an optical field combiner, and first and second primary lens assemblies configured to receive first and second portions of the light from the light field, respectively, and to direct the first and second portions of the light to the optical field combiner, wherein the optical field combiner includes a modulator configured to modulate the first and second portions of the light and to direct modulated first and second portions of the light onto the CPI, and wherein the counters are configured to perform digital signal processing on the digital signal.

(2) The system of configuration (1), wherein the modulator includes first and second reflective modulators that modulate and reflect the first and second portions of the light to a mirror device of the optical field combiner, and wherein the mirror device directs the modulated first and second portions of the light onto the CPI.

(3) The system of configurations (1) through (2), wherein the optical field combiner includes first and second fold mirrors that reflect the first and second portions of the light from the first and second lens assemblies primary lens assemblies onto the multi-sided mirror, and wherein the multi-sided fold mirror directs the first and second portions of the light onto the CPI via the modulator.

(4) The system of configurations (1) through (3), wherein: the light from the light field includes light reflected from an object, and the CPI processes the modulated first and second portions of the light to yield image data for a stereo image of the object.

(5) The system of configuration (4), further comprising a light source configured to illuminate the object.

(6) The system of configuration (4), further comprising a plurality of light sources configured to illuminate the object.

(7) The system of configurations (1) through (6), wherein the pixels of the CPI are configured to detect short-wavelength infrared (SWIR) radiation.

(8) The system of configuration (7), wherein the SWIR radiation has a wavelength in a range of about 0.75 µm to about 3 µm.

(9) The system of configurations (1) through (6), wherein the pixels of the CPI are configured to detect mid-wavelength infrared (MWIR) radiation.

(10) The system of configuration (9), wherein the MWIR radiation has a wavelength in a range of about 3 µm to about 5 µm.

(11) The system of configurations (1) through (6), wherein the pixels of the CPI include high operating temperature (HOT) sensors configured to detect radiation in a range of about 3 µm to about 5 km.

(12) The system of configurations (1) through (11), further comprising a rotatable field scanner configured to perform a wide-area scan of the light field such that a field of view of the optical assembly is greater than about 45°.

(13) The system of configuration (12), wherein the rotatable field scanner is configured to enable light from a plurality of views of the light field to be received by the first and second primary lens assemblies.

(14) The system of configuration (13), wherein the rotatable field scanner is configured to enable: light from a first field of view to be received by the first primary lens assembly, and light from a second field of view to be received by the second primary lens assembly.

(15) The system of configuration (14), wherein: the first field of view is a forward view, and the second field of view is a rearward view.

(16) The system of configurations (1) through (11), further comprising: a first field scanner arranged relative to the first primary lens assembly such that the first portion of the light from the light field corresponds to light from the first field scanner; and a second field scanner arranged relative to the second primary lens assembly such that the second portion of the light from the light field corresponds to light from the second field scanner, wherein one or both of the first and second field scanners covers an angular field of view greater than about 45°.

(17) The system of configurations (1) through (16), wherein the optical assembly is housed in a first housing, the CPI is housed in a second housing, and the first and second housings are detachable from each other.

(18) The system of configuration (17), wherein the first and second housings are detachable from each other via a flange connector.

(19) The system of configuration (17), wherein the first housing or the second housing or both the first and second housings is or are configured to be supported on an automobile.

(20) The system of configuration (17) further comprising: at least one light source configured to illuminate an object; and a controller configured to control a timing of the at least one light source.

(21) The system of configuration (20), wherein the at least one light source includes any one or any combination of: a laser, and a broadband emitter that emits light having a range of different wavelengths.

(22) The system of configuration (21), wherein the laser is configured to emit light having a wavelength in a range of about 0.75 µm to about 3 µm.

(23) The system of configuration (16), wherein a separation distance between the first primary lens assembly and the second primary lens assembly is in a range of about 5 cm to about 15 cm.

(24) The system of configurations (1) through (23), further comprising a modulated light source configured to illuminate an object, wherein: a first counter of the counters of the CPI is synchronized to the first portion of the light received by the first primary lens assembly, a second counter of the counters of the CPI is synchronized the second portion of the light received by the second primary lens assembly, and a third counter of the counters of the CPI is synchronized to the modulated light source.

An imaging system according to the technology described herein may be embodied in different configurations. Example configurations include combinations of configurations (25) through (39), as follows:

(25) An imaging system, comprising: a camera configured to capture images of an environment, the camera including a computational pixel imager (CPI) having a plurality of pixels, each of the pixels including: a first counter configured to count up and down at a frequency F1 of a first modulated light source in the environment, such that a periodicity of an up-down count pattern of the first counter is synchronized with the frequency F1, a second counter configured to count up and down at a frequency F2 of a second modulated light source in the environment, such that a periodicity of an up-down count pattern of the second counter is synchronized with the frequency F2, and a third counter configured to count up and down at a frequency F3 of a third modulated light source in the environment, such that a periodicity of an up-down count pattern of the third counter is synchronized with the frequency F3, wherein the frequencies F1, F2, and F3 are different from each other.

(26) The imaging system of configuration (25), wherein each of the pixels of the CPI includes: a light sensor configured to convert light to photocurrent, and converter circuitry configured to convert the photocurrent to pulses and to provide the pulses to the counters, the converter circuitry comprising one of both of: current-to-frequency circuitry and voltage-to-frequency circuitry.

(27) The imaging system of configurations (25) through (26), further comprising a controller configured to control at least one of the counters independently from at least one other one of the counters.

(28) The imaging system of configurations (25) through (27), wherein the camera is movable within the environment.

(29) The imaging system of configurations (25) through (28), further comprising a processor configured to determine a location of the camera in the environment, wherein: the first, second, and third modulated light sources are located at predetermined positions in the environment, and the processor is configured to determine the location of the camera based on light from the first modulated light source, light from the second modulated light source, and light from the third modulated light source.

(30) The imaging system of configurations (25) through (29), wherein the CPI is configured to produce digital signals and to process the digital signals to produce image data for an image of an object in the environment.

(31) The imaging system of configuration (30), wherein some or all of the pixels of the CPI are configured to perform a differencing process such that: the first counter rejects a signal from an object illuminated by a light source that is not modulated at the frequency F1, the second counter rejects a signal from an object illuminated by a light source that is not modulated at the frequency F2, and the third counter rejects a signal from an object illuminated by a light source that is not modulated at the frequency F3.

(32) The imaging system of configurations (25) through (31), further comprising a laser apparatus configured to project a predetermined light pattern onto an object in the environment, wherein, for some or all of the pixels of the CPI, at least some of the counters are synchronized with a modulation of the predetermined light pattern to enable a detection of a shape of the object by detection of the predetermined light pattern.

(33) The imaging system of configuration (32), wherein the laser apparatus includes a laser source modulated at a frequency FL different from the frequencies F1, F2, and F3.

(34) The imaging system of configuration (33), wherein some or all of the pixels of the CPI include counters that reject a signal from an object illuminated by a light source that is not modulated at the frequency FL.

(35) The imaging system of configurations (25) through (34), further comprising a laser apparatus configured to project a predetermined light pattern onto an object in the environment, wherein, for some or all of the pixels of the CPI, at least some of the counters are synchronized with a modulation of the predetermined light pattern to enable a detection of one or both of: a change in a position of the object and a change in an environment near the object, by detection of the predetermined light pattern.

(36) The imaging system of configurations (25) through (35), further comprising a light source configured to illuminate an object in the environment with modulated light having a frequency greater than 1 MHz, wherein, for some or all of the pixels of the CPI, at least some of the counters are configured to acquire distance data on a distance to the object based on the modulated light returned or scattered from the object.

(37) The imaging system of configuration (36), wherein the frequency of the modulated light is in a range of about 60 MHz to 100 MHz.

(38) The imaging system of configurations (35) through (36), wherein the distance data comprises in-phase (I) and quadrature (Q) phase signals derived from the modulated light returned or scattered from the object.

(39) The imaging system of configurations (29) through (31), wherein: the first counters of the pixels of the CPI are synchronized with the frequency F1 of the first modulated light source and detect data for a first shadow image of the object, the second counters of the pixels of the CPI are synchronized with the frequency F2 of the second modulated light source and detect data for a second shadow image of the object, the third counters of the pixels of the CPI are synchronized with the frequency F3 of the third modulated light source and detect data for a third shadow image of the object, and the processor is programmed to determine at least one of: a geometry of the object and a location of the object, based on the first, second, and third shadow images of the object.

A stereo imaging system according to the technology described herein may be embodied in different configurations. Example configurations include combinations of configurations (4 0) through (48), as follows:

(40) A stereo imaging system, comprising: a computational pixel imager (CPI) having a plurality of pixels; a plurality of modulated light sources, including: a first light source modulated at a first frequency F1 and configured to illuminate an environment with first modulated light, and a second light source modulated at a frequency F2 different from the frequency F1 and configured to illuminate the environment with second modulated light; and an optical assembly configured to receive light from a light field scattered from an object in the environment, and to direct the light to the CPI, wherein each of the pixels of the CPI includes: a light sensor, a plurality of counters configured to receive a photocurrent from the light sensor, to convert the photocurrent to a digital signal, and to perform digital signal processing on the digital signal, wherein the optical assembly includes: a focusing lens configured to receive the first modulated light scattered from the object and the second modulated light scattered from the object, and to direct the first and second modulated light to form first and second images on sensors of the sensors of the CPI, and wherein the CPI processes the first and second modulated light to yield image data for a stereo image of the object.

(41) The system of configuration (4 0), further comprising an optical filter arranged to filter the first and second modulated light scattered from the object.

(42) The system of configurations (4 0) through (41), further comprising a controller configured to control the first and second light sources and the CPI, wherein the controller includes: a first mode in which the first and second modulated light sources are controlled to illuminate the environment simultaneously, and a second mode in which the first and second modulated light sources are controlled to illuminate the environment separately according to a predetermined temporal pattern.

(43) The system of configuration (42), wherein, in the second mode, the controller controls the first and second modulated light sources to illuminate the environment in an alternating pattern such that the CPI receives the first modulated light scattered from the object temporally interleaved with the second modulated light scattered from the object.

(44) The system of configurations (40) through (43), wherein the CPI is configured to subtract data corresponding to the first image from data corresponding to the second image.

(45) The system of configurations (40) through (44), wherein the CPI is configured to apply an equal weight to data corresponding to the first image and data corresponding to the second image.

(46) The system of configurations (40) through (44), wherein the CPI is configured to apply a first weight to data corresponding to the first image, and to apply a second weight to data corresponding to the second image, the first and second weights being different from each other.

(47) The system of configurations (40) through (46), wherein the CPT processes the first modulated light scattered from the object and the second modulated light scattered from the object such that the image data for the stereo image of the object is spatially filtered.

(48) The system of configurations (40) through (47), wherein the CPI processes the first modulated light scattered from the object and the second modulated light scattered from the object such that the image data for the stereo image of the object is temporally filtered.

Methods of using a stereo imaging system according to the technology described herein may be include various processes. Example methods include combinations of processes (49) through (59), as follows:

(49) A method of determining a distance to a moving object, the method comprising: scanning an environment using a stereo imaging system that includes: a plurality of light sources, a CPI of a plurality of pixels, each of the pixels of the CPI including: a light sensor, and electronic circuitry comprising a plurality of counters, and an optical assembly that receives light from the environment and directs the light to the light sensors of the CPI; using the electronic circuitry of the pixels to convert photocurrent produced by the light on the light sensors to a digital signal, and to perform digital signal processing on the digital signal to reject data corresponding to one or more stationary objects in the environment; illuminating one or more moving objects with a light modulated at a predetermined frequency F; for at least some of the pixels of the CPI, causing one or more of the counters to be synchronized with the frequency F of the modulated light, such that a periodicity of an up-down count pattern of the one or more counters is synchronized with the frequency F; detecting scattered light from the one or more moving objects, using the CPI to reject a signal corresponding to light that is not modulated to the frequency F, and using to the scattered light to estimate a distance to each of the one or more moving objects in real time or near real time; and outputting distance data for the one or more moving objects.

(50) The method of process (49), wherein the distance data is a moving image or a still image of the one or more moving objects.
(51) The method of processes (49) through (50), wherein the scanning is performed using an optical scanner rotating at a predetermined frequency.
(52) The method of process (51), wherein the optical scanner is a multi-sided mirror device.
(53) The method of processes (49) through (52), wherein the scanning of the environment covers an angular field of view greater than about 45°.
(54) The method of processes (49) through (52), wherein the scanning of the environment covers an angular field of view greater than about 90°.
(55) The method of processes (49) through (52), wherein the scanning of the environment covers an angular field of view greater than about 120°.
(56) The method of processes (49) through (52), wherein the scanning of the environment covers an angular field of view greater than about 180°.
(57) The method of processes (49) through (52), wherein the scanning of the environment covers an angular field of view of about 250° or greater.
(58) The method of processes (49) through (57), wherein the scanning of the environment is performed by moving a mirror to direct the scattered light to the CPI.
(59) The method of processes (49) through (59), wherein the stereo imaging system is mounted on a moving vehicle.

CONCLUSION

Unless stated otherwise, the terms "approximately" and "about" are used to mean within ±20% of a target value in some embodiments, within ±10% of a target value in some embodiments, within ±5% of a target value in some embodiments, and yet within ±2% of a target value in some embodiments. The terms "approximately" and "about" can include the target value. The term "essentially" is used to mean within ±3% of a target value.

The technology described herein may be embodied as a method, of which at least some acts have been described. The acts performed as part of the method may be ordered in any suitable way. Accordingly, embodiments may be implemented in which acts are performed in an order different than described, which may include performing some acts simultaneously, even though described as sequential acts in illustrative embodiments. Additionally, a method may include more acts than those described, in some embodiments, and fewer acts than those described in other embodiments.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The indefinite articles "a" and "an," as used herein in the specification and in the claims, unless clearly indicated to the contrary, should be understood to mean "at least one."

Any use of the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Any use of the phrase "equal" or "the same" in reference to two values (e.g., distances, widths, etc.) means that two values are the same within manufacturing tolerances. Thus, two values being equal, or the same, may mean that the two values are different from one another by ±5%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

Also, some of the embodiments described above may be implemented as one or more method(s), of which some examples have been provided. The acts performed as part of the method(s) may be ordered in any suitable way. Accordingly, embodiments may be constructed in which acts are performed in an order different than illustrated or described herein, which may include performing some acts simultaneously, even though shown as sequential acts in illustrative embodiments.

Further, although advantages of the present invention may be indicated, it should be appreciated that not every embodiment of the invention will include every described advantage. Some embodiments may not implement any features described as advantageous herein. Accordingly, the foregoing description and attached drawings are by way of example only.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. An imaging system, comprising:
a camera configured to capture images of an environment, the camera including a computational pixel imager (CPI) having a plurality of pixels, each of the pixels including:
a first counter configured to count up and down at a frequency F1 of a first modulated light source in the environment, such that a periodicity of an up-down count pattern of the first counter is synchronized with the frequency F1,
a second counter configured to count up and down at a frequency F2 of a second modulated light source in the environment, such that a periodicity of an up-down count pattern of the second counter is synchronized with the frequency F2, and
a third counter configured to count up and down at a frequency F3 of a third modulated light source in the environment, such that a periodicity of an up-down count pattern of the third counter is synchronized with the frequency F3,
wherein the frequencies F1, F2, and F3 are different from each other.

2. The imaging system of claim 1, wherein each of the pixels of the CPI includes:
a light sensor configured to convert light to photocurrent, and
converter circuitry configured to convert the photocurrent to pulses and to provide the pulses to the counters, the converter circuitry comprising one of both of: current-to-frequency circuitry and voltage-to-frequency circuitry.

3. The imaging system of claim 1, further comprising a controller configured to control at least one of the counters independently from at least one other one of the counters.

4. The imaging system of claim 1, wherein the camera is movable within the environment.

5. The imaging system of claim 1, further comprising a processor configured to determine a location of the camera in the environment, wherein:

the first, second, and third modulated light sources are located at predetermined positions in the environment, and the processor is configured to determine the location of the camera based on light from the first modulated light source, light from the second modulated light source, and light from the third modulated light source.

6. The imaging system of claim 5, wherein the CPI is configured to produce digital signals and to process the digital signals to produce image data for an image of an object in the environment.

7. The imaging system of claim 6, wherein some or all of the pixels of the CPI are configured to perform a differencing process such that:
the first counter rejects a signal from an object illuminated by a light source that is not modulated at the frequency F1,
the second counter rejects a signal from an object illuminated by a light source that is not modulated at the frequency F2, and
the third counter rejects a signal from an object illuminated by a light source that is not modulated at the frequency F3.

8. The imaging system of claim 1, further comprising a laser apparatus configured to project a predetermined light pattern onto an object in the environment,
wherein, for some or all of the pixels of the CPI, at least some of the counters are synchronized with a modulation of the predetermined light pattern to enable a detection of a shape of the object by detection of the predetermined light pattern.

9. The imaging system of claim 8, wherein the laser apparatus includes a laser source modulated at a frequency FL different from the frequencies F1, F2, and F3.

10. The imaging system of claim 9, wherein some or all of the pixels of the CPI include counters that reject a signal from an object illuminated by a light source that is not modulated at the frequency FL.

11. The imaging system of claim 1, further comprising a laser apparatus configured to project a predetermined light pattern onto an object in the environment,
wherein, for some or all of the pixels of the CPI, at least some of the counters are synchronized with a modulation of the predetermined light pattern to enable a detection of one or both of: a change in a position of the object and a change in an environment near the object, by detection of the predetermined light pattern.

12. The imaging system of claim 1, further comprising a light source configured to illuminate an object in the environment with modulated light having a frequency greater than 1 MHz,
wherein, for some or all of the pixels of the CPI, at least some of the counters are configured to acquire distance data on a distance to the object based on the modulated light returned or scattered from the object.

13. The imaging system of claim 12, wherein the frequency of the modulated light is in a range of about 60 MHz to 100 MHz.

14. The imaging system of claim 12, wherein the distance data comprises in-phase (I) and quadrature (Q) phase signals derived from the modulated light returned or scattered from the object.

15. The imaging system of claim 5, wherein:
the first counters of the pixels of the CPI are synchronized with the frequency F1 of the first modulated light source and detect data for a first shadow image of the object, the second counters of the pixels of the CPI are synchronized with the frequency F2 of the second modulated light source and detect data for a second shadow image of the object, the third counters of the pixels of the CPI are synchronized with the frequency F3 of the third modulated light source and detect data for a third shadow image of the object, and the processor is programmed to determine at least one of: a geometry of the object and a location of the object, based on the first, second, and third shadow images of the object.

\* \* \* \* \*